US008618879B2

(12) United States Patent
Mizokami et al.

(10) Patent No.: US 8,618,879 B2
(45) Date of Patent: Dec. 31, 2013

(54) SEMICONDUCTOR DEVICE

(75) Inventors: Masakazu Mizokami, Kanagawa (JP); Kazuaki Hori, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 86 days.

(21) Appl. No.: 13/360,323

(22) Filed: Jan. 27, 2012

(65) Prior Publication Data
US 2012/0206201 A1   Aug. 16, 2012

(30) Foreign Application Priority Data

Feb. 15, 2011   (JP) ................. 2011-029745

(51) Int. Cl.
*H03G 3/20*   (2006.01)
(52) U.S. Cl.
USPC ................ 330/136; 330/51; 330/124 R
(58) Field of Classification Search
USPC ................ 330/51, 136, 124 R
See application file for complete search history.

(56) References Cited

U.S. PATENT DOCUMENTS

2002/0084844 A1 *  7/2002  Monroe ............... 330/51

FOREIGN PATENT DOCUMENTS

JP   2010-273284 A   12/2010

OTHER PUBLICATIONS

Ueda et al., "5-GHz-Band CMOS Power Amplifier Using Current Feedback Circuit with Output Power Detection", Proceedings of the IEICE General Conference, Electronics (1), Mar. 2009, p. 65, C-2-26.
Shinjo et al., "5-GHz-Band CMOS Linear Driver Amplifier Using Base Current Control Circuit with Input Power Detection", Proceedings of the IEICE Electronics Society Conference, Electronics (1), Sep. 2009, p. 64, C-2-36.

* cited by examiner

*Primary Examiner* — Robert Pascal
*Assistant Examiner* — Khiem Nguyen
(74) *Attorney, Agent, or Firm* — McDermott Will & Emery LLP

(57) ABSTRACT

A variable gain amplifier circuit includes output nodes, a plurality of amplifiers, and a detection circuit. The amplifiers are coupled in parallel with each other between the output nodes and a reference node and selectively assume an operating state in accordance with a control signal. The detection circuit outputs a detection signal according to the magnitude of an input signal to each amplifier. Each amplifier includes a first transistor, a second transistor, and a bias circuit. The first transistor receives, at its control electrode, the input signal or a signal proportional to the input signal. The second transistor is series-coupled to the first transistor between the first reference node and an output node. The bias circuit applies a DC voltage of a magnitude according to the detection signal to a control electrode of the second transistor.

6 Claims, 20 Drawing Sheets

FIG. 7

| Amp18 | Amp17 | Amp16 | Amp15 | Amp14 | Amp13 | ... | Amp6 | Amp5 | Amp4 | Amp3 | Amp2 | Amp1 | GAIN | IDEAL VALUE |
|---|---|---|---|---|---|---|---|---|---|---|---|---|---|---|
| 0dB | -6dB | -12dB | -18dB | -24dB | -30dB | ... | -72dB | -78dB | -84dB | -90dB | -96dB | -102dB | (dB) | (dB) |
| 0 | 0 | 0 | 0 | 0 | 0 | ... | 0 | 0 | 1 | 1 | 1 | 1 | -78.52 | -78.5 |
| 0 | 0 | 0 | 0 | 0 | 0 | ... | 0 | 1 | 1 | 0 | 1 | 0 | -78.00 | -78.0 |
| 0 | 0 | 0 | 0 | 0 | 0 | ... | 0 | 1 | 0 | 0 | 0 | 1 | -77.47 | -77.5 |
| 0 | 0 | 0 | 0 | 0 | 0 | ... | 0 | 1 | 0 | 0 | 1 | 0 | -76.97 | -77.0 |
| 0 | 0 | 0 | 0 | 0 | 0 | ... | 0 | 1 | 0 | 1 | 1 | 1 | -76.50 | -76.5 |
| 0 | 0 | 0 | 0 | 0 | 0 | ... | 0 | 1 | 0 | 1 | 0 | 0 | -76.05 | -76.0 |
| 0 | 0 | 0 | 0 | 0 | 0 | ... | 0 | 1 | 0 | 1 | 0 | 1 | -75.63 | -75.5 |
| 0 | 0 | 0 | 0 | 0 | 0 | ... | 0 | 1 | 1 | 0 | 1 | 1 | -75.00 | -75.0 |
| 0 | 0 | 0 | 0 | 0 | 0 | ... | 0 | 1 | 1 | 1 | 0 | 0 | -74.47 | -74.5 |
| 0 | 0 | 0 | 0 | 0 | 0 | ... | 0 | 1 | 1 | 1 | 0 | 1 | -74.11 | -74.0 |
| 0 | 0 | 0 | 0 | 0 | 0 | ... | 0 | 1 | 1 | 1 | 1 | 1 | -73.44 | -73.5 |
| 0 | 0 | 0 | 0 | 0 | 0 | ... | 0 | 1 | 1 | 1 | 0 | 0 | -73.13 | -73.0 |
| 0 | 0 | 0 | 0 | 0 | 0 | ... | 0 | 1 | 1 | 1 | 1 | 1 | -72.52 | -72.5 |
| 0 | 0 | 0 | 0 | 0 | 0 | ... | 1 | 0 | 0 | 0 | 0 | 0 | -72.00 | -72.0 |
| 1 | 0 | 0 | 0 | 0 | 0 | ... | 0 | 0 | 0 | 0 | 0 | 0 | 0.00 | 0.0 |
| 1 | 0 | 0 | 0 | 1 | 0 | ... | 0 | 0 | 0 | 0 | 0 | 0 | 0.53 | 0.5 |
| 1 | 0 | 0 | 1 | 0 | 0 | ... | 0 | 0 | 0 | 0 | 0 | 0 | 1.03 | 1.0 |
| 1 | 0 | 0 | 1 | 1 | 0 | ... | 0 | 0 | 0 | 0 | 0 | 0 | 1.50 | 1.5 |
| 1 | 0 | 1 | 0 | 0 | 0 | ... | 0 | 0 | 0 | 0 | 0 | 0 | 1.95 | 2.0 |
| 1 | 0 | 1 | 0 | 1 | 0 | ... | 0 | 0 | 0 | 0 | 0 | 0 | 2.37 | 2.5 |
| 1 | 0 | 1 | 1 | 0 | 0 | ... | 0 | 0 | 0 | 0 | 0 | 0 | 3.17 | 3.0 |
| 1 | 1 | 0 | 0 | 0 | 0 | ... | 0 | 0 | 0 | 0 | 0 | 0 | 3.53 | 3.5 |
| 1 | 1 | 0 | 0 | 1 | 0 | ... | 0 | 0 | 0 | 0 | 0 | 0 | 3.89 | 4.0 |
| 1 | 1 | 0 | 1 | 0 | 0 | ... | 0 | 0 | 0 | 0 | 0 | 0 | 4.56 | 4.5 |
| 1 | 1 | 1 | 0 | 0 | 0 | ... | 0 | 0 | 0 | 0 | 0 | 0 | 4.87 | 5.0 |
| 1 | 1 | 1 | 1 | 0 | 0 | ... | 0 | 0 | 0 | 0 | 0 | 0 | 5.48 | 5.5 |

Gain = −78 dB

Gain = −77.47 dB

Gain = −75.63 dB

Gain = −72.52 dB

Gain = −72 dB

Gain = −71.47 dB

FIG. 19

| ENV | Amp18 0dB | Amp17 -6dB | Amp16 -12dB | Amp15 -18dB | Amp14 -24dB | Amp13 -30dB | Amp12 -36dB | Amp11 -42dB | Amp10 -48dB | ... | Amp5 -78dB | Amp4 -84dB | Amp3 -90dB | Amp2 -96dB | Amp1 -102dB | GAIN (dB) | IDEAL VALUE (dB) |
|---|---|---|---|---|---|---|---|---|---|---|---|---|---|---|---|---|---|
| 0 | 0 | 0 | 0 | 0 | 0 | 0 | 0 | 0 | 0 | ... | 0 | 0 | 1 | 1 | 1 | -78.52 | -78.5 |
| 0 | 0 | 0 | 0 | 0 | 0 | 0 | 0 | 0 | 0 | ... | 1 | 1 | 0 | 0 | 0 | -78.00 | -78.0 |
| 0 | 0 | 0 | 0 | 0 | 0 | 0 | 0 | 0 | 1 | ... | 1 | 1 | 1 | 1 | 1 | -24.52 | -24.5 |
| 0 | 0 | 0 | 0 | 0 | 1 | 1 | 1 | 1 | 0 | ... | 0 | 0 | 0 | 0 | 0 | -24.00 | -24.0 |
| 0 | 0 | 0 | 0 | 0 | 1 | 1 | 1 | 0 | 1 | ... | 0 | 0 | 0 | 0 | 0 | -23.47 | -23.5 |
| 0 | 0 | 0 | 0 | 0 | 1 | 1 | 0 | 1 | 0 | ... | 0 | 0 | 0 | 0 | 0 | -22.97 | -23.0 |
| 0 | 0 | 0 | 0 | 0 | 1 | 0 | 1 | 0 | 1 | ... | 0 | 0 | 0 | 0 | 0 | -22.50 | -22.5 |
| 0 | 0 | 0 | 0 | 0 | 0 | 1 | 1 | 1 | 0 | ... | 0 | 0 | 0 | 0 | 0 | -22.05 | -22.0 |
| 0 | 0 | 0 | 0 | 0 | 0 | 1 | 1 | 0 | 1 | ... | 0 | 0 | 0 | 0 | 0 | -21.63 | -21.5 |
| 0 | 0 | 0 | 0 | 1 | 0 | 1 | 0 | 1 | 0 | ... | 0 | 0 | 0 | 0 | 0 | -21.00 | -21.0 |
| 0 | 0 | 0 | 0 | 1 | 0 | 0 | 1 | 0 | 1 | ... | 0 | 0 | 0 | 0 | 0 | -20.83 | -20.5 |
| 0 | 0 | 0 | 0 | 1 | 0 | 0 | 1 | 0 | 1 | ... | 0 | 0 | 0 | 0 | 0 | -20.47 | -20.5 |
| 0 | 0 | 0 | 0 | 1 | 0 | 0 | 0 | 1 | 0 | ... | 0 | 0 | 0 | 0 | 0 | -20.11 | -20.0 |
| 0 | 0 | 0 | 0 | 1 | 0 | 0 | 0 | 1 | 0 | ... | 0 | 0 | 0 | 0 | 0 | -19.44 | -19.5 |
| 0 | 0 | 0 | 0 | 1 | 0 | 1 | 1 | 0 | 0 | ... | 0 | 0 | 0 | 0 | 0 | -19.13 | -19.0 |
| 1 | 0 | 0 | 1 | 0 | 1 | 1 | 0 | 0 | 0 | ... | 0 | 0 | 0 | 0 | 0 | -18.52 | -18.5 |
| 1 | 0 | 0 | 1 | 0 | 0 | 1 | 0 | 1 | 0 | ... | 0 | 0 | 0 | 0 | 0 | -18.00 | -18.0 |
| 1 | 0 | 0 | 1 | 0 | 0 | 1 | 0 | 0 | 0 | ... | 0 | 0 | 0 | 0 | 0 | -17.47 | -17.5 |
| 1 | 0 | 0 | 1 | 0 | 0 | 0 | 1 | 0 | 0 | ... | 0 | 0 | 0 | 0 | 0 | -16.97 | -17.0 |
| 1 | 0 | 0 | 1 | 0 | 0 | 0 | 0 | 1 | 0 | ... | 0 | 0 | 0 | 0 | 0 | -16.50 | -16.5 |
| 1 | 1 | 1 | 0 | 0 | 0 | 0 | 0 | 0 | 0 | ... | 0 | 0 | 0 | 0 | 0 | 4.87 | 5.0 |
| 1 | 1 | 1 | 1 | 0 | 0 | 0 | 0 | 0 | 0 | ... | 0 | 0 | 0 | 0 | 0 | 5.48 | 5.5 |

SEMICONDUCTOR DEVICE

CROSS-REFERENCE TO RELATED APPLICATIONS

The disclosure of Japanese Patent Application No. 2011-29745 filed on Feb. 15, 2011 including the specification, drawings and abstract is incorporated herein by reference in its entirety.

BACKGROUND

The present invention relates to a semiconductor device including a variable gain amplifier circuit.

Recently, there has been proceeding development of multimode RFICs (Radio Frequency Integrated Circuits) which conform to GSM (Global System for Mobile Communications), EDGE (Enhanced Data Rates for GSM Evolution), and WCDMA (Wideband Code Division Multiple Access) which are related art communication standards for cellular phones and LTE (Long Term Evolution) which is a next-generation high-speed data communication standard.

For a transmission system of such a multimode RFIC, transmission power control having a high dynamic range and a high accuracy step defined in the 3GPP (Third Generation Partnership Project) standard is required. Further, it is required to reduce reception band noise to negate the need for a SAW (Surface Acoustic Wave) filter.

Japanese Unexamined Patent Publication No. 2010-273284 (Patent Document 1) discloses a variable gain amplifier circuit having a high dynamic range, high accuracy, and low noise necessary to meet these requirements. Specifically, in the variable gain amplifier circuit in Patent Document 1, 21 amplifiers having gains varying in 6 dB steps are coupled in parallel. The inputs of the amplifiers are coupled to a common input terminal, and the outputs of the amplifiers are coupled to a common load. The amplifiers are selectively put into an operating state in accordance with a control word, thereby controlling the gain of the variable gain amplifier circuit.

Further, the requirements of the multimode transmission system include higher linearity of a transmission amplifier. In order to restrain distortion of an LTE signal having a high PAPR (Peak to Average Power Ratio) within specifications, it becomes necessary to enhance the linearity of the transmission amplifier. Only increasing a power source voltage supplied to the amplifier can suppress the signal distortion but decreases the efficiency of the amplifier.

Envelope tracking is known as one means for achieving an amplifier having high linearity and high efficiency. The envelope tracking is a technique for adjusting a power source voltage supplied to the amplifier in accordance with the amplitude of an input signal (corresponding to the envelope of a signal waveform). By increasing the power source voltage as the amplitude of the input signal increases, it is possible to always use the transistor in a state close to saturation power.

Techniques described in Non-patent Documents 1 and 2 are known as examples in which envelope tracking is applied to a 5-GHz-band CMOS (Complementary Metal Oxide Semiconductor) amplifier. In a circuit configuration described in Non-patent Document 1, an output current detection circuit is added to a related art cascode amplifier. In a circuit configuration described in Non-patent Document 2, an input detection circuit for generating a detection current according to an input power and a bias circuit for adding a feedback current proportional to the detection current to a bias current are added to a related art amplifier.

[Patent Document 1]
Japanese Unexamined Patent Publication No. 2010-273284
[Non-Patent Document 1]
Ueda and four others, "5-GHz-Band CMOS Power Amplifier of Output Current Feedback Type", Proceedings of the IEICE General Conference, Electronics (1), March 2009, C-2-26, P. 65
[Non-Patent Document 2]
Shinjo and three others, "5-GHz-Band CMOS Linear Transmission Driver Amplifier of Input Detection Current Compensation Type", Proceedings of the IEICE Electronics Society Conference, Electronics (1), September 2009, C-2-36, P. 64

SUMMARY

Although application of the envelope tracking technique to the variable gain amplifier circuit described in Japanese Unexamined Patent Publication No. 2010-273284 (Patent Document 1) makes it possible to meet all the requirements of the multimode transmission system, such an example has not been known. If such a detection circuit as described in Non-patent Document 1 or 2 is added to all the 21 amplifiers described in Patent Document 1, a circuit area increases and a consumption current also increases. Particularly, in the circuit configuration described in Non-patent Document 1, a current flowing through a load is diverted, and the diverted current is detected by the output current detection circuit. Accordingly, in consideration of circuit variation and the limitation of the line width of the transistor, a diversion ratio cannot be largely increased. Therefore, it is difficult to suppress the consumption current of the detection circuit.

It is an object of the present invention to provide a semiconductor device including a variable gain amplifier having a high dynamic range, high accuracy, low noise, and high linearity.

A semiconductor device according to an embodiment of the invention includes a variable gain amplifier circuit for amplifying an input signal by a gain according to a control signal. The variable gain amplifier circuit includes an output node for outputting an amplified input signal, a plurality of amplifiers, and a detection circuit. The amplifiers are coupled in parallel with each other between the output node and a first reference node to which a first reference potential is provided and selectively assume an operating state in accordance with the control signal. The detection circuit detects the input signal and outputs a detection signal according to the magnitude of the detected input signal to each of the amplifiers. Each of the amplifiers includes a first transistor, a second transistor, and a first bias circuit. The first transistor receives, at its control electrode, the input signal or a signal proportional to the input signal. The second transistor is series-coupled to the first transistor between the first reference node and the output node. The first bias circuit applies a DC voltage of a magnitude according to the detection signal to a control electrode of the second transistor.

According to the above embodiment, it is possible to provide a semiconductor device including a variable gain amplifier having a high dynamic range, high accuracy, low noise, and high linearity.

BRIEF DESCRIPTION OF THE DRAWINGS

FIG. 7 is a table listing the relationship between the control of the operating state of the amplifier units Amp1 to Amp18 and the gain of the RFPGA 35;

FIG. 19 is a table listing the relationship between the control of the operating state of the amplifier units Amp1 to Amp18 and the gain of the RFPGA 35;

DETAILED DESCRIPTION

Figure 1:
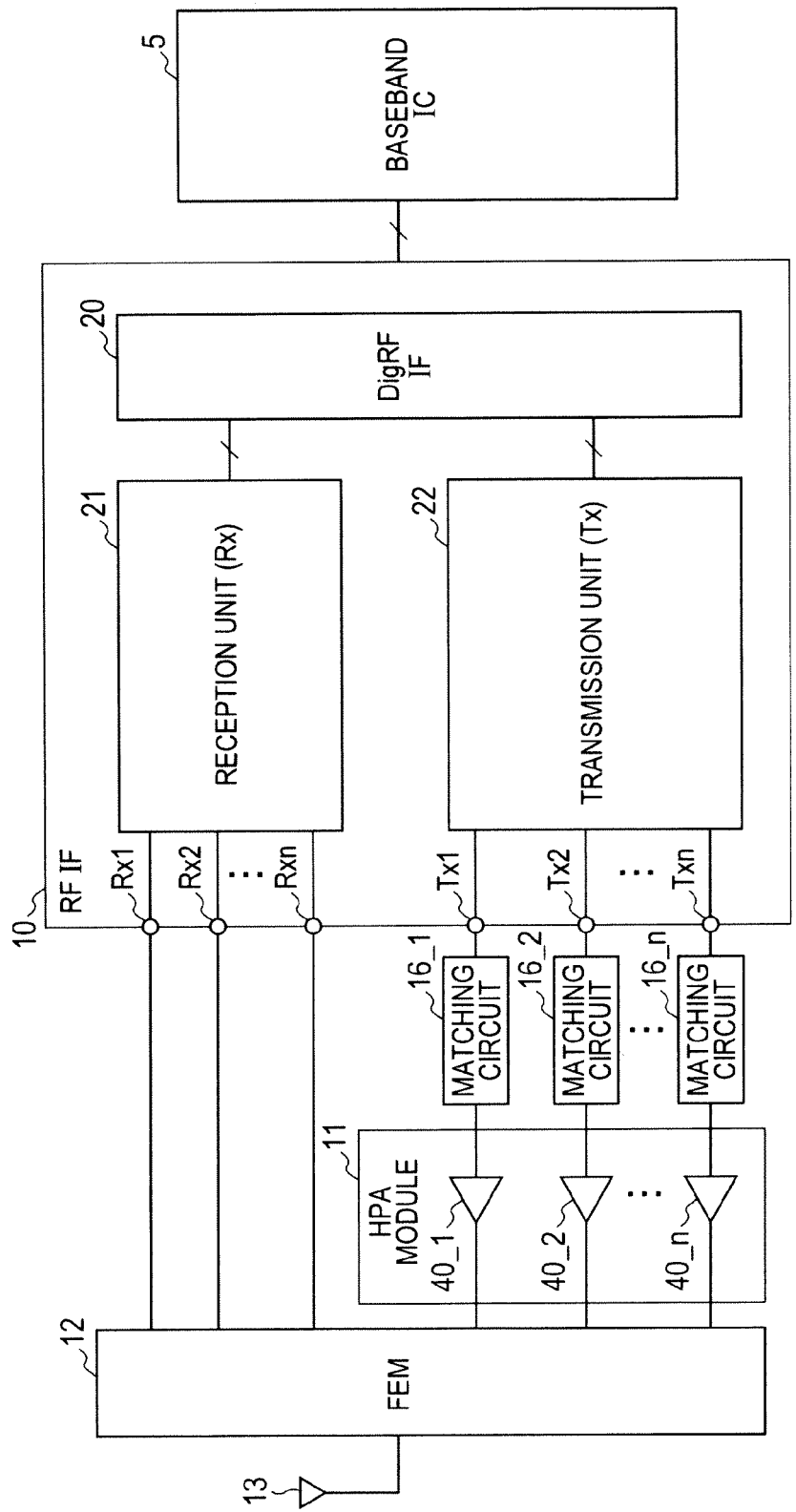
FIG. 1 is a block diagram showing the configuration of a radio communication system 1 incorporating an RFIC 10 according to a first embodiment of the present invention.

Hereinafter, preferred embodiments of the present invention will be described in detail with reference to the accompanying drawings. The same or corresponding parts are denoted by the same reference numerals, and their description will not be repeated.

First Embodiment

[Schematic Configuration of Radio Communication System]

FIG. 1 is a block diagram showing the configuration of a radio communication system 1 incorporating an RFIC 10 according to a first embodiment of the invention. The radio communication system 1 of FIG. 1 is used, for example, in a cellular phone. The radio communication system 1 includes the RFIC 10, a baseband IC (Integrated Circuit) 5, an HPA (High Power Amplifier) module 11, matching circuits 16_1 to 16_n, a front end module (FEM) 12, and an antenna 13.

(RFIC) The RFIC 10 is a one-chip transceiver IC (communication semiconductor integrated circuit) which can transmit and receive RF (Radio-Frequency) signals to/from a base station through the antenna in conformity with three main transmission/reception standards of "GSM/EDGE", "WCDMA/HSPA", and "LTE".

GSM is a second generation (2G) mobile phone standard achieved by TDD (Time Division Duplex)-TDMA (Time Division Multiple Access). EDGE is an extended standard for packet communication in the GSM scheme. In EDGE, 8PSK (8 Phase Shift Keying) is used as a digital modulation scheme.

WCDMA is a third generation (3G) mobile phone standard achieved by FDD (Frequency Division Duplex)-CDMA (Code Division Multiple Access), which is known as UMTS (Universal Mobile Telecommunications Systems) in the U.S. and Europe. HSPA (High Speed Packet Access) is an extended standard for high-speed packet communication in WCDMA, and is particularly called a 3.5G mobile phone standard.

LTE is a mobile phone standard of higher speed and wider band than HSPA, and is called a 3.9G mobile phone standard. In LTE, OFDMA (Orthogonal Frequency Division Multiple Access) is adopted for downstream, and SC-FDMA (Single Carrier Frequency Division Multiple Access) is adopted for upstream.

As shown in FIG. 1, the RFIC 10 includes a reception unit (RX) 21, a transmission unit (TX) 22, and a digital RF interface (DigRF IF) 20.

The reception unit 21 down-converts a reception RF signal received by the antenna 13 from the base station into an analog reception baseband signal, using a local carrier signal (local oscillation signal). Further, the reception unit 21 performs AD (Analog-to-Digital) conversion of the analog reception baseband signal into a digital reception baseband signal.

The transmission unit 22 performs DA (Digital-to-Analog) conversion of a digital transmission baseband signal into an analog transmission baseband signal, and up-converts the analog transmission baseband signal into a transmission RF signal, using a local carrier signal. The transmission unit 22 radio-transmits the transmission RF signal to the base station through the antenna 13.

The digital RF interface 20 is an interface between the RFIC 10 and the baseband IC 5 in compliance with an interface standard developed by MIPI Alliance (MIPI: Mobile Industry Processor Interface).

The RFIC 10 further has a plurality of output terminals Tx1 to Txn each for outputting an RF signal and a plurality of input terminals Rx1 to Rxn each for receiving an RF signal. The output terminals are paired with the input terminals, like (Tx1, Rx1), ..., (Txn, Rxn), and a pair of output and input terminals used is determined in accordance with a band (frequency band) used in the RFIC.

(Baseband IC) The baseband IC 5 performs digital demodulation and other signal processes respectively corresponding to the three transmission/reception modes on a digital reception baseband signal received from the RFIC 10 to generate reception data (voice, image, or other data). Further, the baseband IC 5 performs digital modulation and other signal processes respectively corresponding to the three transmission/reception modes on transmission data (voice, image, or other data) to generate a digital transmission baseband signal, and transfers the digital transmission baseband signal to the RFIC 10. Although not shown in FIG. 1, the cellular phone having the radio communication system 1 incorporated therein includes an application processor, a memory, a speaker, a microphone, an input key, and a LCD monitor, which exchange signals with the baseband IC 5.

(HPA Module) The HPA module 11 includes a plurality of HPAs (High Power Amplifiers) 40_1 to 40_n provided corresponding to the output terminals Tx1 to Txn respectively. Each HPA amplifies a transmission RF signal received through a matching circuit from the corresponding output terminal. The HPAs each are configured with a single semiconductor chip and are modularized within a package. The matching circuits 161 to 16_n are inserted between the output terminals Tx1 to Txn and the HPAs 40_1 to 40_n, respectively. Each matching circuit matches the output impedance of the transmission unit 22 to the input impedance of the HPA. The matching circuits 16_1 to 16_n are externally provided to the RFIC 10 in FIG. 1, but also can be internally provided in the RFIC 10.

(Front End Module) The front end module 12 selects one pair of the input/output terminal pairs (Rx1, Tx1) to (Rxn, Txn), and couples the selected input/output terminal pair (Rxi, Txi) (i is an integer between 1 and n inclusive) to the antenna 13.

Figure 2:
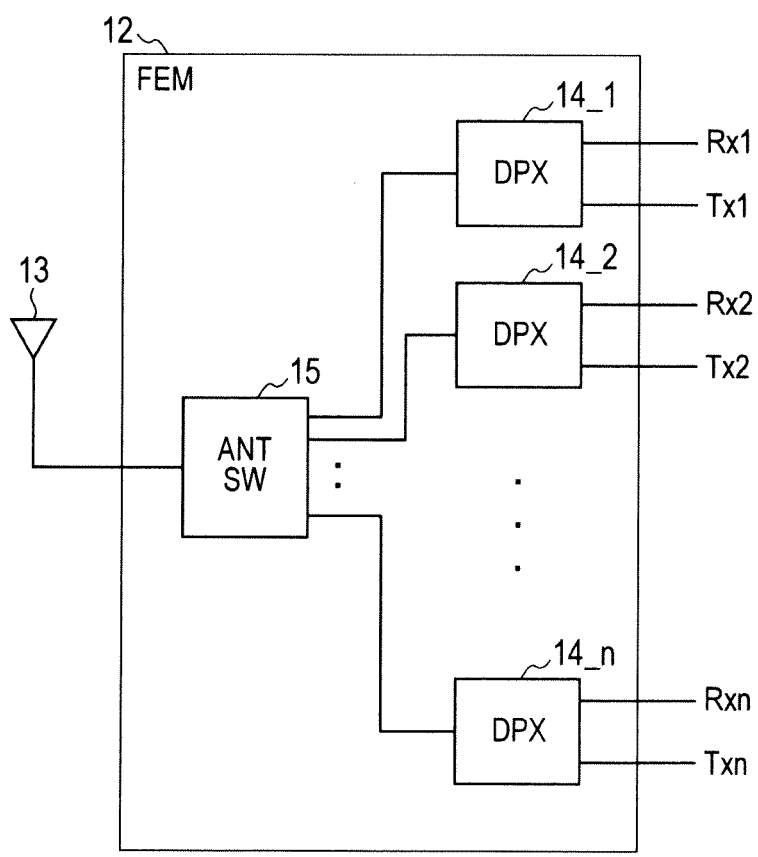
FIG. 2 is a block diagram showing the specific configuration of a front end module 12 in FIG. 1.

FIG. 2 is a block diagram showing the specific configuration of the front end module 12 in FIG. 1. Referring to FIGS. 1 and 2, the front end module 12 includes an antenna switch (ANT-SW) 15 and a plurality of duplexers (DPX) 14_1 to 14_n (also unspecifically called the duplexer 14) corresponding to the input/output terminal pairs (Rx1, Tx1) to (Rxn, Txn) respectively.

The antenna switch 15 selects one duplexer 14 in accordance with a frequency band used, and couples the selected duplexer 14 to the antenna 13. The selected duplexer 14 sends a transmission RF signal from the corresponding output terminal Txi (i is an integer between 1 and n inclusive) to the antenna 13, and sends a reception RF signal from the antenna 13 to the corresponding input terminal Rxi. At this time, the duplexer 14 restrains the transmission RF signal from leaking into the input terminal Rxi and restrains the reception RF signal from leaking into the output terminal Txi. Thereby, the FDD scheme is implemented in transmission/reception to/from the base station. The antenna switch 15 and the duplexers 14_1 to 14_n each are configured with a single semiconductor chip and are modularized within one package.

[Configuration of Transmission Unit]

Figure 3:
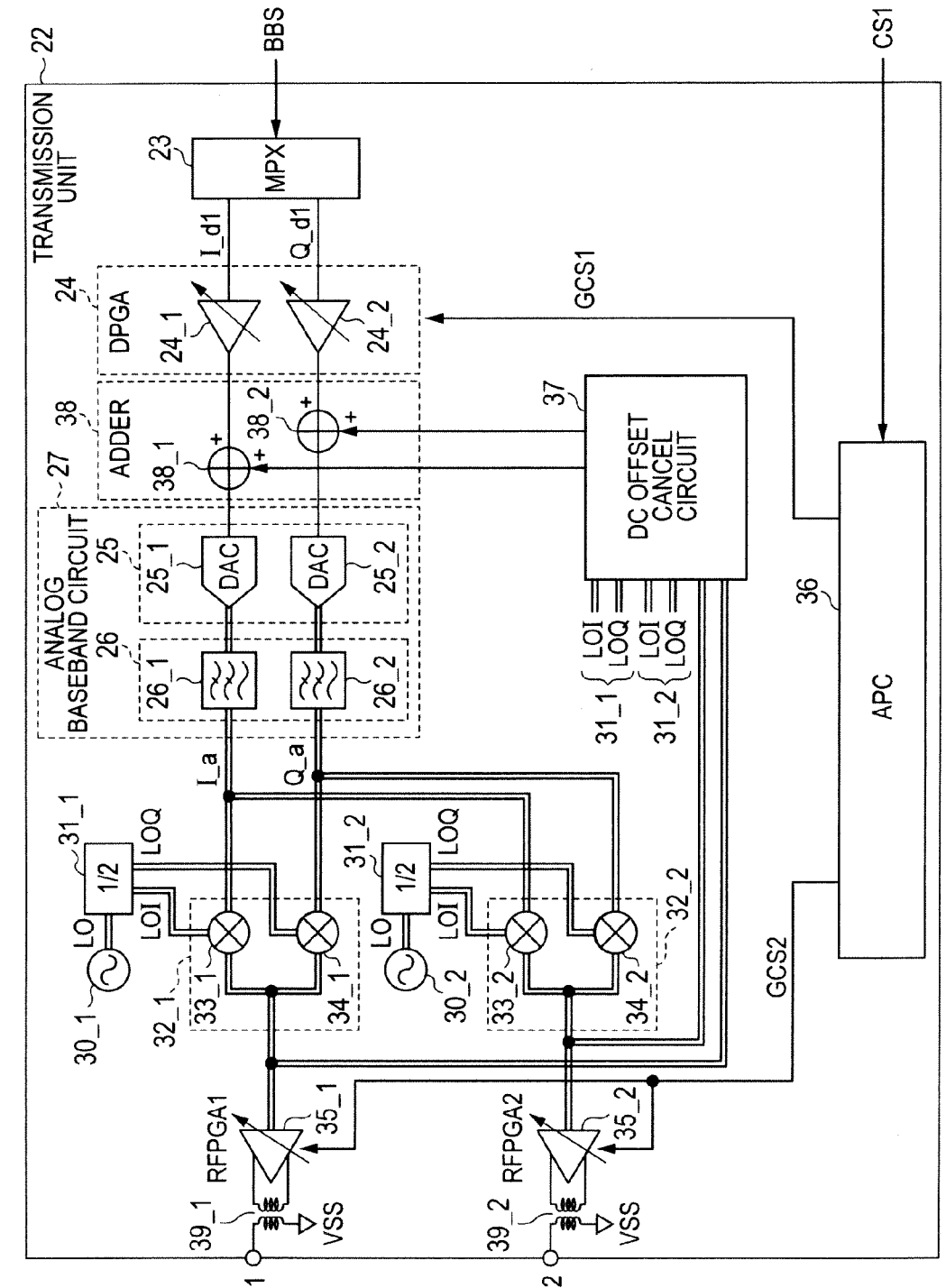
FIG. 3 is a block diagram showing the detailed configuration of a transmission unit 22 in FIG. 1.

FIG. 3 is a block diagram showing the detailed configuration of the transmission unit 22 in FIG. 1.

The transmission unit 22 receives, through the digital RF interface 20, the digital transmission baseband signal generated by the baseband IC 5 in FIG. 1 in accordance with each transmission mode. The transmission unit 22 up-converts the received digital transmission baseband signal by direct conversion to generate an RF signal.

The transmission unit 22 can generate RF signals in a plurality of frequency bands ranging from 800 MHz to 2.5 GHz. The frequency bands (bands) are determined by a standard. Typically, "Band 1", "Band 2", and "Band 7" are used. "Band 1" is a 1920-1980 MHz band, "Band 2" is a 1850-1910 MHz band, and "Band 7" is a 2500-2570 MHz band.

Referring to FIG. 3, the transmission unit 22 includes a multiplexer (MPX) 23, two digital programmable gain amplifiers (DPGA) 24_1 and 24_2, two adders 38_1 and 38_2, two digital-to-analog converters (DAC) 25_1 and 25_2, low-pass filters (LPF) 26_1 and 26_2, and an automatic power controller (APC) 36. An analog baseband circuit 27 is configured with the DACs 25 (25_1, 25_2) and the low-pass filters 26 (26_1, 26_2).

The transmission unit 22 further includes a plurality of local oscillators 30 (30_1, 30_2), a plurality of ½ frequency dividers 31 (31_1, 31_2), a plurality of quadrature modulators 32 (32_1, 32_2), a DC offset cancel circuit 37, a plurality of radio-frequency programmable gain amplifiers (RFPGA) 35 (35_1, 35_2), and high-frequency transformers 39_1 and 39_2 (also collectively or unspecifically called the local oscillator 30, the ½ frequency divider 31, the quadrature modulator 32, and the RFPGA 35). The local oscillator 30, the ½ frequency divider 31, the quadrature modulator 32, the RFPGA 35, and the high-frequency transformers 39_1 and 39_2 are provided corresponding to the frequency band of each transmission mode in principle, but may be shared between close frequency bands. Although FIG. 3 typically shows two pieces per element, the actual number is not limited to two. Hereinafter, each constituent element will be described.

(Multiplexer) The digital transmission baseband signal (transmission data) received through the digital RF interface 20 from the baseband IC 5 includes a 1-bit data signal generated by serially transferring an in-phase component signal (I signal) and a quadrature component signal (Q signal). In association with the 1-bit data signal, the digital transmission baseband signal further includes a 1-bit clock signal to which the 1-bit data signal synchronizes and a 1-bit enable signal for enabling data capture.

The multiplexer 23 multiplexes the serially transferred I and Q signals, and converts the serial I and Q signals into respective parallel signals (I signal I_d1, Q signal Q_d1) comprised of a plurality of bits.

(DPGA) The DPGAs 24_1 and 24_2 (also collectively called the DPGA 24) are variable gain amplifiers. The DPGA 24_1 amplifies the parallel digital I signal I_d1 by digital processing. That is, the DPGA 24_1 converts the value of the I signal I_d1 into a value obtained by multiplying the I signal I_d1 by a gain. In the same way, the DPGA 24_2 amplifies the parallel digital Q signal Q_d1 by digital processing. The gain of each DPGA is adjusted by a gain control signal GCS1 so that the same gain is obtained between the two DPGAs 24_1 and 24_2. For example, if the gain control signal GCS1 indicates a gain adjustment to 1 dB, both the gains of the DPGAs 24_1 and 24_2 are adjusted to 1 dB. The gain control signal GCS1 is supplied from the APC 36.

(DAC, Low-Pass Filter) The amplified digital I and Q signals outputted from the DPGAs 24_1 and 24_2 are inputted to the adders 38_1 and 38_2 (also collectively called the adder 24). The adders 38_1 and 38_2 add DC offset correction signals outputted from the DC offset cancel circuit 37 described later to the digital I and Q signals.

The DAC 25_1 converts the digital I signal outputted from the adder 38_1 into a differential analog signal. The low-pass filter 26_1 eliminates the higher frequency band of the analog I signal outputted from the DAC 25_1 than a cutoff frequency. In the same way, the DAC 25_2 converts the digital Q signal outputted from the adder 38_2 into a differential analog signal. The low-pass filter 26_2 eliminates the higher frequency band of the analog Q signal outputted from the DAC 25_2 than a cutoff frequency.

(Local Oscillator, ½ Frequency Divider, Quadrature Modulator) The local oscillator 30 generates a differential local oscillation signal (clock signals having the same frequency and a phase difference of 180 degrees) LO.

The ½ frequency divider 31 generates local oscillation signals LOI and LOQ by dividing the frequency of the local oscillation signal LO by 2. The local oscillation signal LOI synchronizes to the rising edge of the original signal LO, and the local oscillation signal LOQ synchronizes to the falling edge of the original signal LO. Thereby, the local oscillation signal LOQ becomes 90 degrees out of phase with the local oscillation signal LOI.

The quadrature modulator 32 receives the local oscillation signals LOI and LOQ outputted from the corresponding ½ frequency divider 31 and the analog I signal I_a and Q signal Q_a outputted from the low-pass filters 26_1 and 26_2. The quadrature modulator 32 quadrature-modulates the local oscillation signals LOI and LOQ by the I signal I_a and the Q signal Q_a into an analog transmission RF signal resulting from the I signal I_a and the Q signal Q_a being up-converted to the frequency of the local oscillation signals LOI and LOQ. More specifically, the quadrature modulator 32 includes a mixer 33 for mixing the local oscillation signal LOI and the I signal I_a and a mixer 34 for mixing the local oscillation signal LOQ and the Q signal Q_a. The output of the mixers 33 and 34 is outputted as the transmission RF signal to the subsequent RFPGA 35.

In accordance with the frequency band of the transmission signal in the RFIC, a proper quadrature modulator 32 for up-conversion is used. The quadrature modulator 32_1 performs up-conversion to a frequency band (Band 7) higher than 2000 MHz, and the quadrature modulator 32_2 performs up-conversion to a plurality of frequency bands (e.g., Band 1, Band 2) lower than 2000 MHz. The quadrature modulators 32 operate exclusively. That is, while one quadrature modulator corresponding to a frequency band used by the RFIC operates, the other quadrature modulator does not operate.

(DC Offset Cancel Circuit) The DC offset cancel circuit 37 is provided to prevent the leak of the carrier signal (called a carrier leak) which occurs in the quadrature modulators 32_1 and 32_2, i.e., to cancel the DC offset between differential signals of the baseband signal inputted to the quadrature modulator 32 which is a cause of the carrier leak. Specifically, the DC offset cancel circuit 37 calculates correction amounts, using the outputs of the quadrature modulators 32_1 and 32_2 and the local carrier signals LOI and LOQ from the frequency dividers 31_1 and 31_2. The DC offset cancel circuit 37 calculates the correction amounts for reducing the DC offset between differential signals, and supplies the calculated correction amounts to the adders 38_1 and 38_2. The adders 38_1 and 38_2 add the results calculated by the DC offset cancel circuit 37 to the digital baseband signals outputted from the two DPGAs 24_1 and 24_2, and output the corrected digital baseband signals. The specific configuration of the DC offset cancel circuit 37 is described, for example, in Japanese Patent Application No. 2009-281360.

(RFPGA) The RFPGAs 35_1 and 35_2 are provided corresponding to the quadrature modulators 32_1 and 32_2 respectively. The RFPGA 35 is a variable gain amplifier circuit for amplifying the transmission RF signal outputted from the corresponding quadrature modulator 32, and performs an amplification operation while the corresponding quadrature modulator 32 operates. While one RFPGA corresponding to a frequency band used by the RFIC operates, the other RFPGA does not operate. The gain of the RFPGA 35 is adjusted by a gain control signal GCS2 from the APC 36. As described later, the gain control signal GCS2 is a 29-bit digital code.

(High-frequency Transformer) The high-frequency transformers 39_1 and 39_2 isolate the DC components of the output signals of the RFPGAs 35_1 and 35_2 respectively for conversion into single-ended signals, and perform impedance conversion. The output signals of the high-frequency transformers 39_1 and 39_2 are outputted from the output terminals Tx1 and Tx2 respectively.

[Configuration of RFPGA]

Next, the configuration of the RFPGA 35 to which the invention particularly pertains will be described.

Specifications about power control in the WCDMA transmission system are defined in 3GPP/TS25.101 in the 3GPP standard of the third generation mobile phone. Specifically, a dynamic range of 74 dB or more, a step width of 1 dB or less, and a step accuracy of ±0.5 dB or less are specified. Further, specifications about power control in the LTE transmission system are defined in 3GPP/TS36.101. Specifically, a dynamic range of 68 dB or more, a step width of 1 dB or less, and a step accuracy of ±0.5 dB or less are specified. Since it is necessary to meet the specifications even if production variation, temperature fluctuation, fluctuation in power source voltage, or the like occurs, the RFPGA according to this embodiment is designed to have a dynamic range of 84 dB, a step width of 0.5 dB, and a step accuracy of ±0.3 dB.

Figure 4:
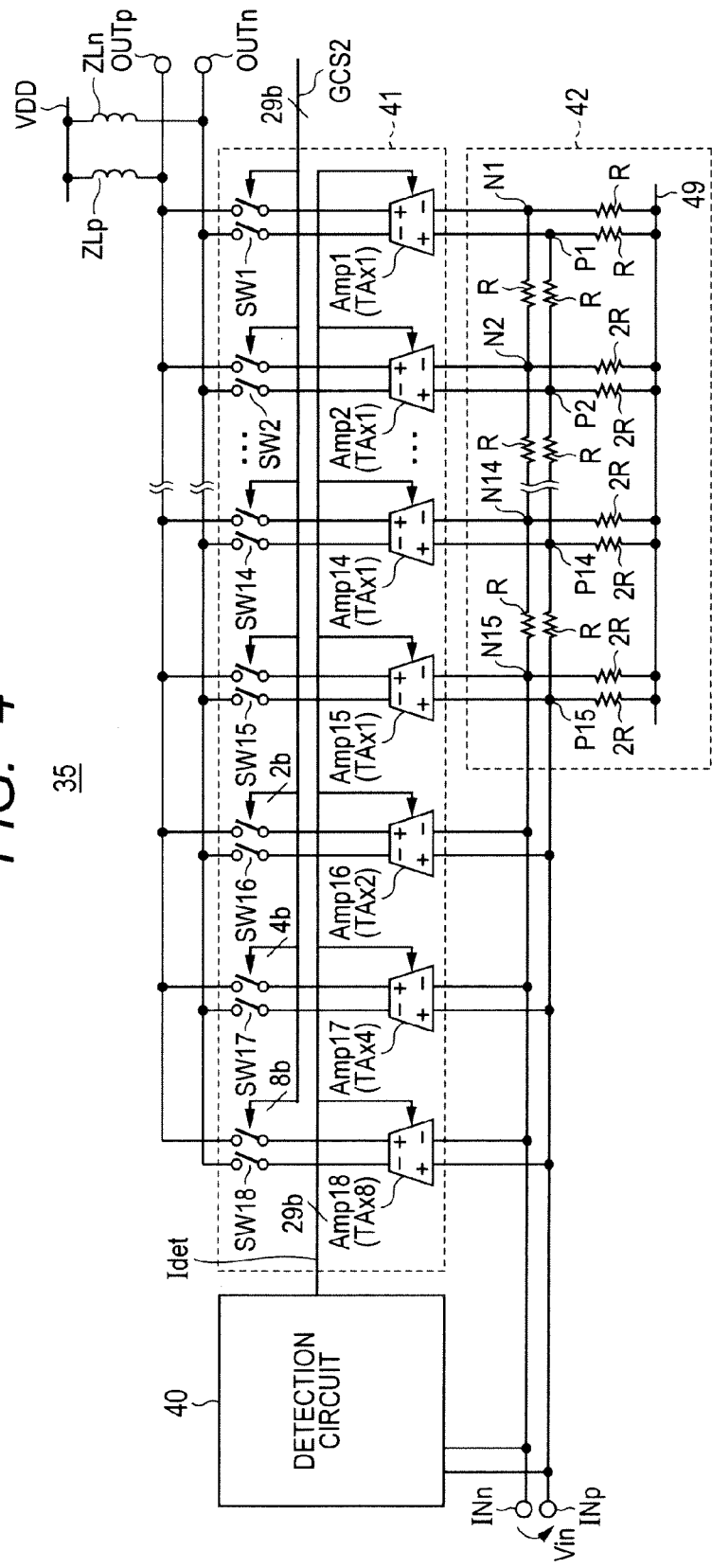
FIG. 4 is a diagram showing an example of the configuration of an RFPGA 35.

FIG. 4 is a diagram showing an example of the configuration of the RFPGA 35. Referring to FIG. 4, the RFPGA 35 includes input terminals INp and INn, output terminals OUTp and OUTn, load inductors ZLp and ZLn, an R-2R resistor ladder network 42, a voltage-current conversion unit 41, and a detection circuit 40. Hereinafter, the R-2R resistor ladder network 42 is abbreviated as a resistor ladder 42.

Differential voltage signals are inputted to the input terminals INp and INn. A positive voltage signal is inputted to the input terminal INp, and a negative voltage signal is inputted to the input terminal INn. Amplified differential voltage signals are outputted from the output terminals OUTp and OUTn. A positive voltage signal is outputted from the output terminal OUTp, and a negative voltage signal is outputted from the output terminal OUTn.

The load inductor ZLp is coupled between a power source line VDD to which a power source potential is provided and the output terminal OUTp, and the load inductor ZLn is coupled between the power source line VDD and the output terminal OUTn.

(Resistor Ladder) The resistor ladder 42 is a circuit for dividing an input voltage Vin provided between the input terminals INp and INn. The resistor ladder 42 includes a plurality of resistive elements coupled in network form. In the example of FIG. 4, a resistor of resistance value R is provided between each adjacent pair of the nodes P1 to P15, and a resistor of resistance value R is provided between each adjacent pair of the nodes N1 to N15. Further, a resistor of resistance value R is provided between each of the nodes P1, N1 and a virtual AC ground line 49, and a resistor of resistance value 2×R is provided between each of the nodes P2 to P15, N2 to N15 and the virtual AC ground line 49. The nodes P15 and N15 of the resistor ladder 42 are coupled to the input terminals INp and INn respectively to receive the differential input voltage Vin.

In the resistor ladder 42 shown in FIG. 4, the resistors may be replaced with impedance elements. That is, the resistor of resistance value R may be replaced with the impedance element of impedance Z, and the resistor of resistance value 2×R may be replaced with the impedance element of impedance 2×Z.

According to the configuration of the resistor ladder 42, the voltage applied between the first nodes P1 and N1 is half the voltage applied between the second nodes P2 and N2, and the voltage applied between the second nodes P2 and N2 is half the voltage applied between the third nodes P3 and N3. In the same way, the voltage applied between the ith nodes Pi and Ni is half the voltage applied between the (i+1)th nodes Pi+1 and Ni+1 (i is an integer between 1 and 14 inclusive). Since the voltage applied between the 15th nodes P15 and N15 is equal to the input voltage Vin provided between the input terminals INp and INn, the voltage applied between the ith nodes Pi and Ni becomes equal to a value obtained by dividing the input voltage Vin by 2 raised to the (15−i)th power. That is, the voltage applied between the corresponding nodes Pi and Ni of the nodes P1 to P15 and N1 to N15 varies in steps of 6 dB.

(Voltage-Current Conversion Unit) The voltage-current conversion unit 41 includes 18 amplifier units Amp1 to Amp18 and 18 switch units SW1 to SW18 corresponding to the amplifier units respectively. The switch units SW1 to SW18 are selectively turned on or off in accordance with the gain control signal GCS2 received from the APC 36 in FIG. 3. Hereinafter, the amplifier units Amp1 to Amp18 and the switch units SW1 to SW18 are also collectively or unspecifically called the amplifier unit Amp and the switch unit SW respectively.

First, the coupling of the input and output nodes of the amplifier unit Amp will be described. If each of the amplifier units Amp1 to Amp15 is represented as the amplifier unit Ampi (i is an integer between 1 and 15 inclusive), the positive (+) and negative (−) input nodes of the amplifier unit Ampi are coupled to the ith nodes Pi and Ni of the resistor ladder 42, respectively. The positive and negative input nodes of each of the amplifier units Amp16 to Amp18 are coupled to the input terminals INp and INn respectively. The positive (+) and negative (−) output nodes of each of the amplifier units Amp1 to Amp18 are coupled to the output terminals OUTp and OUTn through the corresponding switch units SW, respectively.

Next, the general operation of the amplifier unit Amp will be described. The amplifier unit Amp converts the inputted differential voltage signals into differential current signals, which are outputted to the load inductors ZLp and ZLn. Each of the amplifier units Amp1 to Amp15 of the amplifier units Amp1 to Amp18 has the same transconductance. If each of the amplifier units Amp1 to Amp15 has transconductance Gm, the amplifier units Amp16, Amp17, Amp18 have transconductance 2×Gm, 4×Gm, 8×Gm, respectively. Since each of the amplifier units Amp1 to Amp14 receives a respective voltage obtained by reducing the input voltage Vin by a magnification according to the coupling nodes Pi and Ni of the resistor ladder 42, the amplifier units Amp1 to Amp18 finally output current signals amplified by gains varying in steps of 6 dB, to the load inductors ZLp and ZLn.

However, in the load inductors ZLp and ZLn, all current signals outputted from all amplifier units Amp are not added together. Since the switch units SW1 to SW18 are selectively turned on in accordance with the gain control signal GCS2 outputted from the APC 36 in FIG. 3, the amplifier unit Amp corresponding to each switch unit SW selectively assumes an operating state in accordance with the gain control signal GCS2. Therefore, current signals outputted from amplifier units Amp that are in the operating state in accordance with the gain control signal GCS2 are added together in the load inductors ZLp and ZLn, and voltage signals according to the addition results are outputted from the output terminals OUTp and OUTn. Thereby, the gain control of the RFPGA 35 is implemented.

More specifically, the amplifier units Amp16, Amp17, and Amp18 are configured with a plurality of transconductance amplifiers TA having the same configuration and coupled in parallel. That is, the amplifier unit Amp16 includes two transconductance amplifiers TA coupled in parallel, the amplifier unit Amp17 includes four transconductance amplifiers TA coupled in parallel, and the amplifier unit Amp18 includes eight transconductance amplifiers TA coupled in parallel. The amplifier units Amp1 to Amp15 each include one transconductance amplifier TA having the same configuration. Therefore, the voltage-current conversion unit in FIG. 4 is configured with 29 transconductance amplifiers TA in total. The detailed configuration of the transconductance amplifier TA will be described later with reference to FIG. 5.

Thus, the RFPGA 35 of FIG. 4 characteristically controls the gain by selectively putting the transconductance amplifiers TA coupled in parallel into the operating state. The RFPGA of the related art controls the gain by adjusting the number of cascade-coupled amplifiers and is therefore apt to have high noise, so that a SAW filter is needed to eliminate reception band noise. On the other hand, according to the RFPGA 35 shown in FIG. 4, it is possible to reduce the reception band noise, which negates the need for the SAW filter.

The gain control signal GCS2 for switching between the operating state and non-operating state of the 29 transconductance amplifiers TA is a 29-bit digital signal. Although simplified in FIG. 4, the switch unit SW16 is coupled to the differential outputs of the amplifier unit Amp16 configured with two transconductance amplifiers TA, and therefore configured with four switches in reality. Similarly, the switch unit SW17 is configured with eight switches, and the switch unit SW18 is configured with sixteen switches.

(Detection Circuit) The detection circuit 40 detects the input voltage Vin provided between the input terminals INp and INn, generates a detection current Idet according to the amplitude of the input voltage Vin, and outputs the generated detection current Idet to the transconductance amplifiers TA configuring the amplifier units Amp1 to Amp18. Since the voltage-current conversion unit 41 includes the 29 transconductance amplifiers TA as described above, the detection current Idet is outputted through 29 signal lines to the transconductance amplifiers TA. Each transconductance amplifier TA adjusts the drain voltage (drain-source voltage) of an amplifying transistor in accordance with the magnitude of the detection current Idet. Thereby, envelope tracking is implemented. The detailed configuration of the detection circuit 40 will be described later with reference to FIG. 6.

[Detailed Configuration of Transconductance Amplifier]

Figure 5:
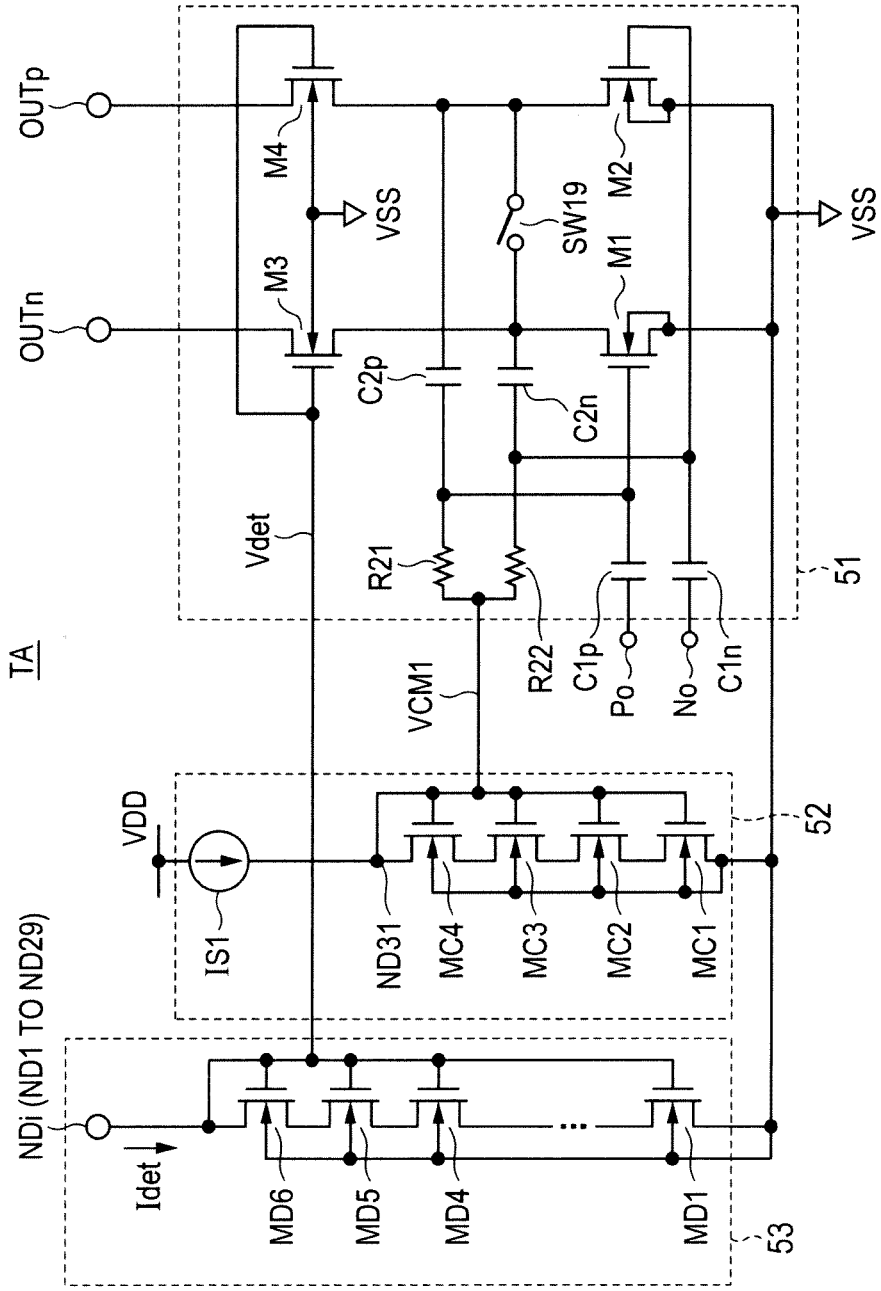
FIG. 5 is a circuit diagram showing the configuration of a transconductance amplifier TA provided in each amplifier unit Amp in FIG. 4.

FIG. 5 is a circuit diagram showing the configuration of the transconductance amplifier TA provided in the amplifier unit Amp in FIG. 4. Referring to FIG. 5, the transconductance amplifier TA includes a pseudo-differential amplifier 51 and bias circuits 52 and 53.

The pseudo-differential amplifier 51 includes NMOS (Negative-channel Metal Oxide Semiconductor) transistors M1 to M4, capacitors C1$p$, C1$n$, C2$p$, and C2$n$, resistive elements R21 and R22, and a switch element SW19. The transistors M1 and M3 are coupled in series between a ground node VSS to which a ground potential is provided and the output terminal OUTn in this order. The transistors M2 and M4 are coupled in series between the ground node VSS and the output terminal OUTp in this order, and coupled in parallel with the series-coupled transistors M1 and M3. The bodies of the transistors M1 to M4 are coupled to the ground node VSS. The capacitor C2$p$ is provided between the gate of the transistor M1 and the drain of the transistor M2, and the capacitor C2$n$ is provided between the gate of the transistor M2 and the drain of the transistor M1.

The transistors M1 and M2 configure a differential pair and function as a source-grounded differential amplifier. The gates of the transistors M1 and M2 are coupled through the capacitors C1$p$ and C1$n$ to input nodes Po and No, respectively. In the case of the transconductance amplifier TA provided in the amplifier unit Amp1 in FIG. 4, the input nodes Po and No correspond to the first nodes P1 and N1 of the resistor ladder 42, respectively. Similarly, in the case of the transconductance amplifier TA provided in the amplifier unit Ampi (i is an integer between 1 and 15 inclusive), the input nodes Po and No correspond to the ith nodes Pi and Ni of the resistor ladder 42, respectively. In the case of the transconductance amplifier TA provided in the amplifier units Amp16 to Amp18, the input nodes Po and No correspond to the input terminals INp and INn in FIG. 4, respectively.

The gates of the transistors M1 and M2 are further coupled through the resistive elements R21 and R22 to an output node ND31 of the bias circuit 52, respectively. Thereby, a constant DC voltage VCM1 is applied to the gates of the transistors M1 and M2.

The transistors M3 and M4 are cascode-coupled to the transistors M1 and M2 respectively. The gates of the transistors M3 and M4 are coupled to an output node NDi of the bias circuit 53. Thereby, a DC voltage Vdet according to the detection current Idet is applied to the gates of the transistors M3 and M4. In each of the 29 transconductance amplifiers TA, the output node NDi corresponds to one of the nodes ND1 to ND29 in FIG. 6 described later.

The bias circuit 52 includes a constant current source IS1 provided between the power source line VDD and the output node ND31 and NMOS transistors MC1 to MC4 coupled in series between the output node ND31 and the ground node VSS. The gates of the transistors MC1 to MC4 are coupled to the output node ND31, and the bodies thereof are coupled to the ground node VSS. A current outputted from the constant current source IS1 flows through the series-coupled transistors MC1 to MC4 used as a load circuit, thereby generating the bias voltage VCM1 at the output node ND31.

The bias circuit 53 includes NMOS transistors MD1 to MD6 coupled in series between the output node NDi and the ground node VSS. The gates of the transistors MD1 to MD6 are coupled to the output node NDi, and the bodies thereof are coupled to the ground node VSS. The detection current Idet outputted from the detection circuit 40 in FIG. 4 flows through the series-coupled transistors MD1 to MD6 used as a load circuit, thereby generating the bias voltage Vdet at the output node NDi.

The switch element SW19 is coupled between the drains of the transistors M1 and M2. At the time of putting the transconductance amplifier TA into a non-operating state, the detection current Idet and the output of the constant current source IS1 are cut off by switches (not shown). Further, by turning on the switch element SW19, the drains of the transistors M1 and M2 are coupled together, and the gates of the transistors M1 to M4 are coupled to the ground node VSS.

[Detailed Configuration of Detection Circuit]

Figure 6:
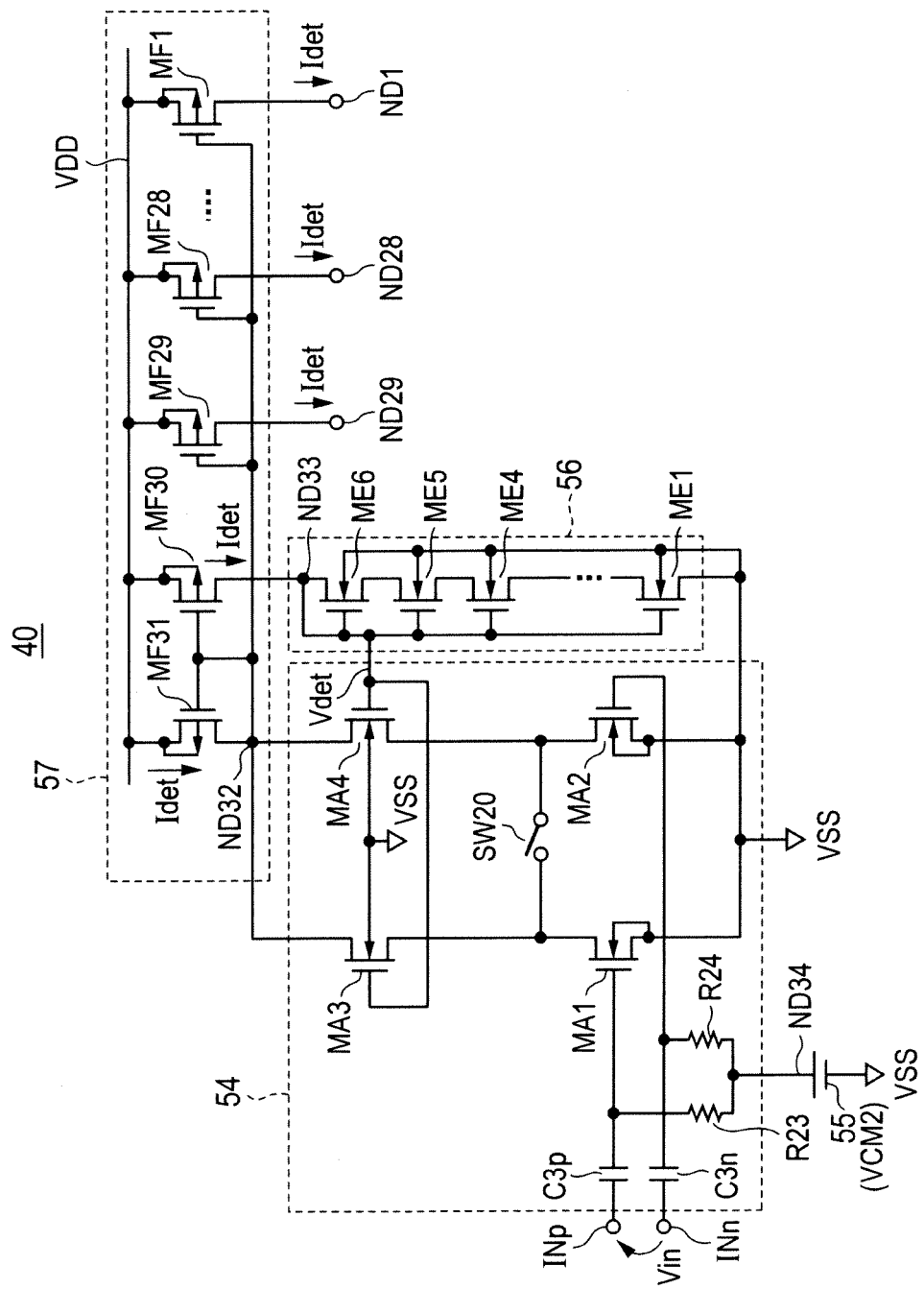
FIG. 6 is a circuit diagram showing the configuration of a detection circuit 40 in FIG. 4.

FIG. 6 is a circuit diagram showing the configuration of the detection circuit 40 in FIG. 4. Referring to FIG. 6, the detection circuit 40 includes a pseudo-differential amplifier 54, bias circuits 55 and 56, and a current mirror circuit 57.

The pseudo-differential amplifier 54 includes NMOS transistors MA1 to MA4, capacitors C3p and C3n, resistive elements R23 and R24, and a switch element SW20 coupled between the drains of the transistors MA1 and MA2. When the detection circuit 40 is in an operating state, the switch element SW20 is in an off state.

The pseudo-differential amplifier 54 is a replica of the pseudo-differential amplifier 51 provided in the transconductance amplifier TA of FIG. 5, and has almost the same configuration as the pseudo-differential amplifier 51. That is, the transistors MA1 and MA3 are coupled in series between the ground node VSS and a coupling node ND32 in this order. The transistors MA2 and MA4 are coupled in series between the ground node VSS and the coupling node ND32 in this order, and coupled in parallel with the series-coupled transistors MA1 and MA3. The bodies of the transistors MA1 to MA4 are coupled to the ground node VSS. The sizes (i.e., gate lengths and gate widths) of the transistors MA1 to MA4 are preferably equal to the sizes of the transistors M1 to M4 in FIG. 5, respectively.

The transistors MA1 and MA2 configure a differential pair and function as a source-grounded differential amplifier. The gates of the transistors MA1 and MA2 are coupled through the capacitors C3p and C3n to the input terminals INp and INn, respectively. The gates of the transistors MA1 and MA2 are further coupled through the resistive elements R23 and R24 to an output node ND34 of the bias circuit 55, respectively. Thereby, a constant DC voltage VCM2 is applied to the gates of the transistors MA1 and MA2. The bias circuit 55 has the same configuration as the bias circuit 52 in FIG. 5 for example.

The transistors MA3 and MA4 are cascode-coupled to the transistors MA1 and MA2 respectively. The gates of the transistors MA3 and MA4 are coupled to an output node ND33 of the bias circuit 56. Thereby, a DC voltage Vdet according to the detection current Idet is applied to the gates of the transistors MA3 and MA4. Preferably, the bias circuit 56 has the same configuration as the bias circuit 53 in FIG. 5 so that the bias voltage Vdet applied to the gates of the transistors MA3 and MA4 becomes equal to the bias voltage Vdet applied to the transistors M3 and M4 in FIG. 5.

The bias circuit 56 includes NMOS transistors ME1 to ME6 coupled in series between the output node ND33 and the ground node VSS. The gates of the transistors ME1 to ME6 are coupled to the output node ND33, and the bodies thereof are coupled to the ground node VSS. The detection current Idet copied by the current mirror circuit 57 flows through the series-coupled transistors ME1 to ME6 used as a load circuit, thereby generating the bias voltage Vdet at the output node ND33.

The current mirror circuit 57 includes PMOS (Positive-channel Metal Oxide Semiconductor) transistors MF1 to MF31. The sources of the transistors MF1 to MF31 are coupled to the power source line VDD, and the gates thereof are coupled to the coupling node ND32. The drain of the transistor MF31 is coupled to the coupling node ND32. The drain of the transistor MF30 is coupled to the output node ND33 of the bias circuit 56. The transistors MF1 to MF15 correspond to the transconductance amplifiers TA configuring the amplifier units Amp1 to Amp15 in FIG. 4, respectively. The drain of each transistor is coupled to the output node NDi of the bias circuit 53 in the corresponding transconductance amplifier TA. The transistors MF16 and MF17 correspond to the two transconductance amplifiers TA configuring the amplifier unit Amp16, respectively. The drains of the transistors MF16 and MF17 are coupled to the output nodes ND16 and ND17 of the bias circuits 53 provided in the corresponding two transconductance amplifiers TA, respectively. The transistors MF18 to MF21 correspond to the four transconductance amplifiers TA configuring the amplifier unit Amp15, respectively. The drains of the transistors MF18 to MF21 are coupled to the output nodes ND18 to ND21 of the bias circuits 53 provided in the corresponding four transconductance amplifiers TA, respectively. The transistors MF22 to MF29 correspond to the eight transconductance amplifiers TA configuring the amplifier unit Amp18, respectively. The drains of the transistors MF22 to MF29 are coupled to the output nodes ND22 to ND29 of the bias circuits 53 provided in the corresponding eight transconductance amplifiers TA, respectively.

The detection current Idet according to the amplitude of the input voltage Vin inputted between the gates of the differential pair transistors MA1 and MA2 flows through the transistor MF31. If all the sizes of the transistors MF1 to MF31 are equal, the detection current Idet is copied into the transistors MF1 to MF30. The detection current Idet flowing through the transistor MF30 generates the DC voltage Vdet in the load circuit (the series-coupled transistors ME1 to ME6) provided in the bias circuit 56. The detection current Idet flowing through each of the transistors MF1 to MF29 is outputted to the corresponding transconductance amplifier TA, as a detection signal according to the amplitude of the input voltage Vin. In the transconductance amplifier TA, the DC voltage Vdet according to the detection current Idet is generated at the load circuit (the series-coupled transistors MD1 to MD6) provided in the bias circuit 53.

In the above description, the detection current Idet flowing through the transistor MF31 is outputted to each transconductance amplifier TA as the detection signal; however, it may also be considered that the voltage at the coupling node ND32 is outputted to each transconductance amplifier TA as the detection signal. In this case, each of the transistors MF1 to MF29 configures the bias circuit 53 together with the corresponding transconductance amplifier TA, and the detection circuit 40 outputs the voltage at the coupling node ND32 to each bias circuit 53 as the detection signal.

[Gain Control]

Hereinafter, the operation of the RFPGA 35 shown in FIGS. 4 to 6 will be described in detail. First, gain control will be described.

FIG. 7 is a table listing the relationship between the control of the operating state of the amplifier units Amp1 to Amp18 and the gain of the RFPGA 35. In FIG. 7, the gain of the amplifier unit Amp18 alone is 0 dB, the gain of the amplifier unit Amp17 alone is −6 dB, and the gain of each amplifier unit Amp alone is sequentially decremented by 6 dB. The operating state of the amplifier unit Amp is represented by "1", and the non-operating state is represented by "0". As shown in FIG. 7, by selectively putting the amplifier units Amp1 to Amp18 into the operating state, it is possible to perform gain control having an 84 dB dynamic range in 0.5 dB steps with a step accuracy of ±0.3 dB.

FIGS. 8A to 8F are diagrams of assistance in explaining a method for performing gain control from −78 dB to −71.5 dB in 0.5 dB steps. In FIGS. 8A to 8F, when an amplifier unit Amp is in the operating state, the triangular symbol of the amplifier unit Amp is solidly shaded.

Referring to FIG. 7 and FIGS. 8A to 8F, gain control from −78 dB to −72.5 dB in 0.5 dB steps is implemented by the amplifier unit Amp5 which always assumes the operating state and the on/off control of the switch units SW1 to SW4 for the amplifier units Amp4, . . . , Amp1 having gains decreased in steps of 6 dB from the gain of the amplifier unit Amp5. The amplifier units Amp other than the five amplifier units Amp1 to Amp5 are in the non-operating state.

Figure 8A:
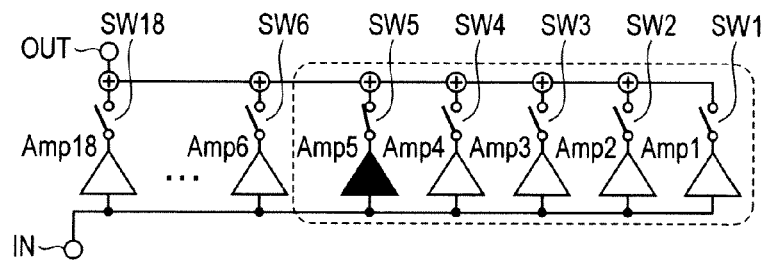
FIGS. 8A, 8B, 8C, 8D, 8E and 8F are diagrams of assistance in explaining a method for performing gain control from −78 dB to −71.5 dB in 0.5 dB steps.

Specifically, referring to FIG. 8A, by turning on the switch unit SW5, only the amplifier unit Amp5 assumes the operating state, and the other amplifier units Amp assume the non-operating state, so that the gain becomes −78 dB.

Figure 8B:
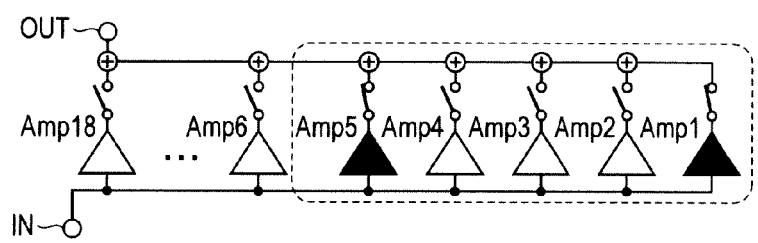

Referring to FIG. 8B, in order to increase the gain shown in FIG. 8A by 0.5 dB, the switch units SW5 and SW1 are turned on so that the amplifier units Amp5 and Amp1 assume the operating state, and the other amplifier units Amp assume the non-operating state. In this case, the gain is calculated as: −78 dB+(−102) dB=−77.47 dB. Since the step width is 0.53 dB, gain control in approximately a 0.5 dB step can be implemented.

Figure 8C:
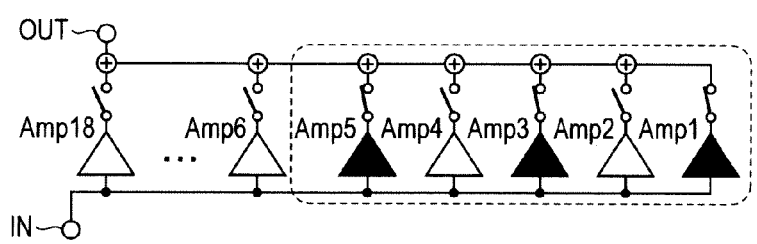

Referring to FIG. 8C, in order to increase the gain shown in FIG. 8A by 2.5 dB, the amplifier units Amp5, Amp3, and Amp1 assume the operating state, and the other amplifier units Amp assume the non-operating state. In this case, the gain becomes −75.63 dB; therefore, approximately a −75.5 dB gain can be implemented.

Figure 8D:
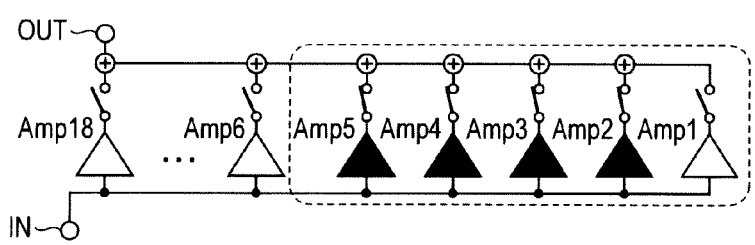

Referring to FIG. 8D, in order to increase the gain shown in FIG. 8A by 5.5 dB, the amplifier units Amp5, Amp4, Amp3, and Amp2 assume the operating state, and the other amplifier units Amp assume the non-operating state. In this case, the gain becomes −72.52 dB.

Figure 8E:
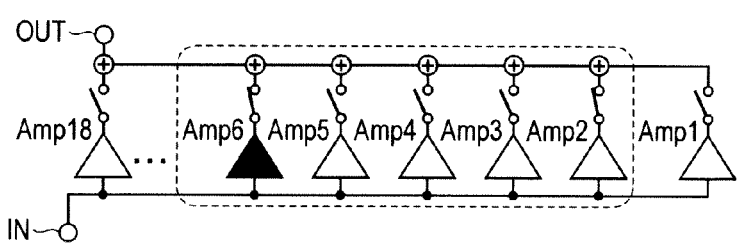

Referring to FIG. 8E, if from the state shown in FIG. 8D, the amplifier unit Amp1 further assumes the operating state, the gain becomes −72.24 dB, which cannot lead to the 0.5 dB step. Therefore, as shown in FIG. 8E, the amplifier unit Amp6 assumes the operating state and the other amplifier units Amp assume the non-operating state, thereby implementing a −72 dB gain.

Figure 8F:
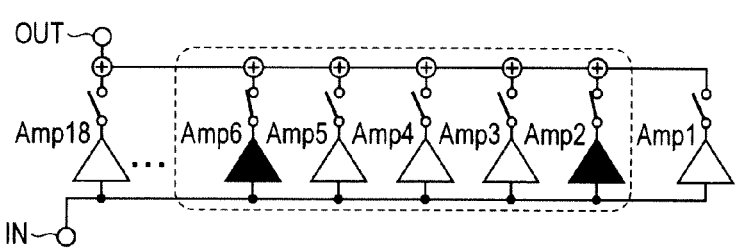

Gain control from −72 dB to −66.5 dB in 0.5 dB steps is implemented by the amplifier unit Amp6 which always assumes the operating state and the on/off control of the switch units SW2 to SW5 for the amplifier units Amp5, . . . , Amp2 having gains decreased in steps of 6 dB from the gain of the amplifier unit Amp6. For example, as shown in FIG. 8F, in order to increase the gain shown in FIG. 8E by 0.5 dB, the switch units SW6 and SW2 are turned on so that the amplifier units Amp6 and Amp2 assume the operating state, and the other amplifier units Amp assume the non-operating state. In this case, the gain becomes −71.47 dB; therefore, approximately a −71.5 dB gain is implemented.

In the same way, the amplifier unit Amp that always assumes the operating state is successively shifted, and the amplifier unit Amp that always assumes the operating state and four amplifier units having gains decreased in steps of 6 dB from the gain thereof are used, thereby implementing gain control in 0.5 dB steps.

[Necessity of Higher Linearity of Input-Output Characteristic]

Figure 9:
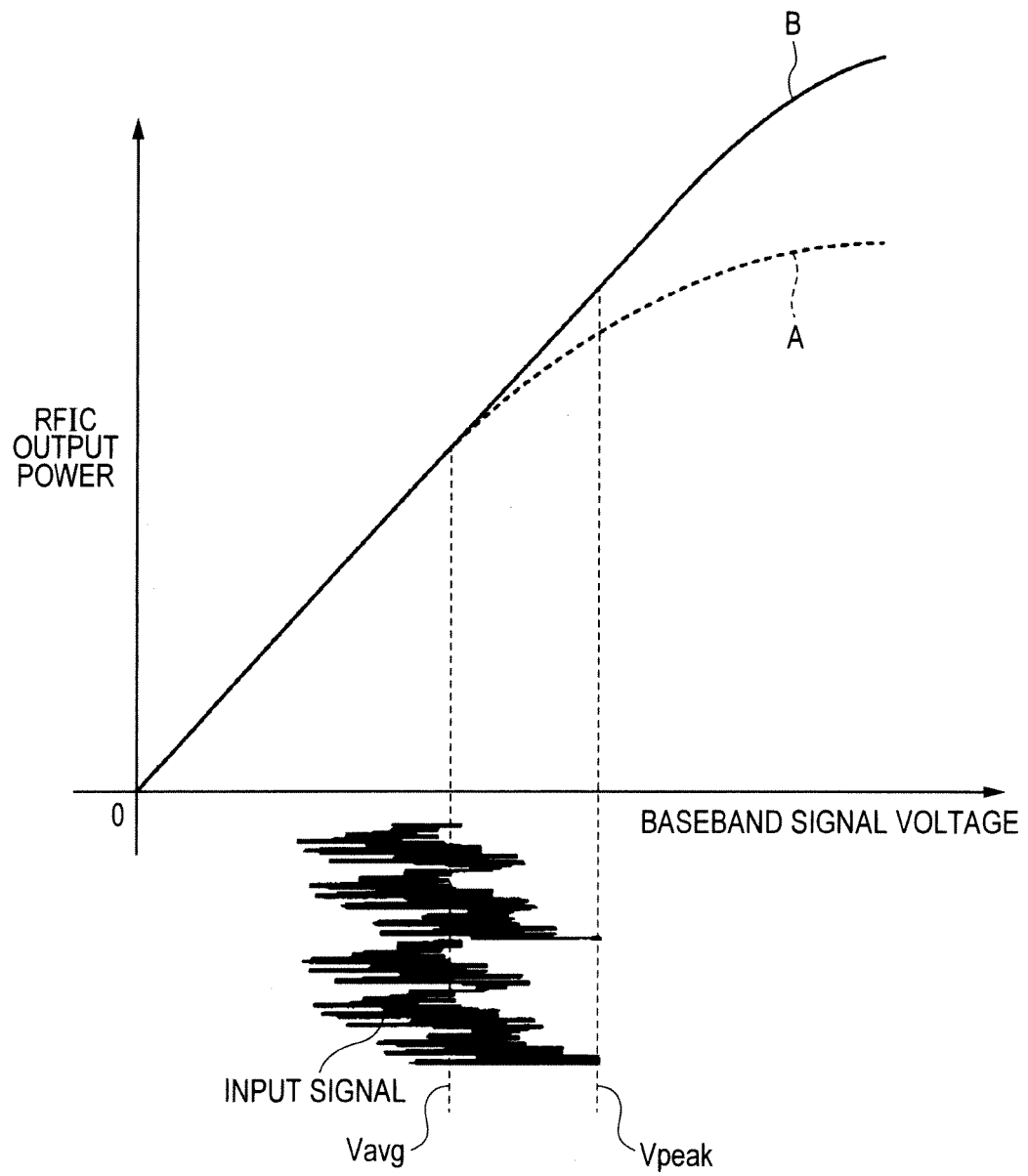
FIG. 9 is a diagram showing the input-output characteristic of the transmission system.

FIG. 9 is a diagram showing the input-output characteristic of the transmission system. In FIG. 9, the horizontal axis represents the baseband signal voltage, and the vertical axis represents the RFIC output power. A solid characteristic curve B represents the improved linearity of the input-output characteristic in comparison with a dashed characteristic curve A.

The PAPR of GSM as the second generation mobile phone standard (2G) is 1.5 dB, the PAPR of WCDMA as the third generation mobile phone standard (3G) is 3.5 dB, and the PAPR of LTE as the 3.9 generation mobile phone standard (3.9G) is 8.2 dB. Thus, the PAPR increases with the generation of the mobile phone standard. As shown in FIG. 9, when a signal of a relatively high PAPR is inputted to the transmission system having the input-output characteristic indicated by the characteristic curve A, a gain around a peak voltage Vpeak decreases compared to a gain around an average voltage Vavg. Therefore, the output signal becomes distorted and the modulation accuracy becomes deteriorated. Accordingly, in order to deal with the LTE signal, it is necessary to improve the linear characteristic of the transmission system as indicated by the characteristic curve B.

[Operation of Transconductance Amplifier (Principle of Envelope Tracking)]

Next, the principle of envelope tracking in the transconductance amplifier TA of FIG. 5 will be described.

Figure 10:
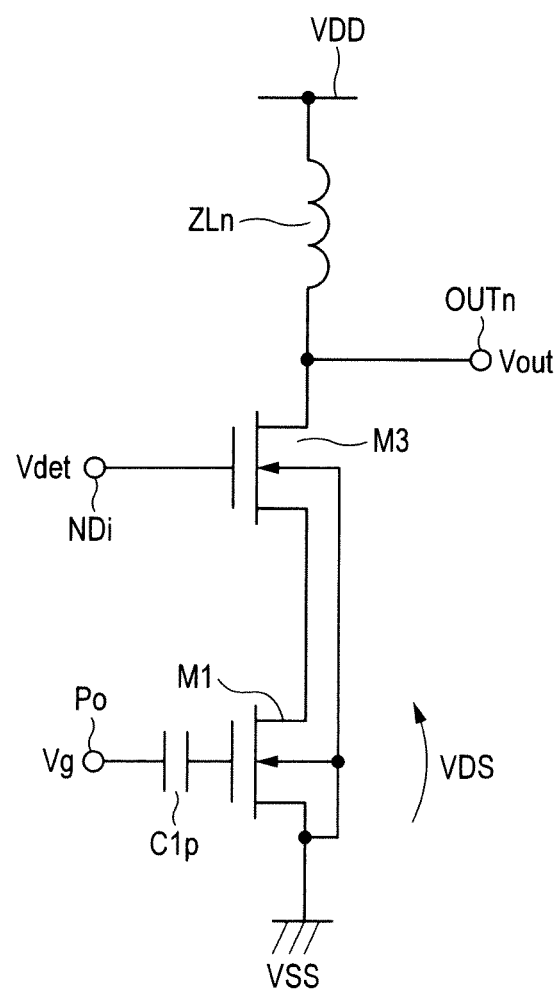
FIG. 10 is a diagram showing transistors M1 and M3 and their coupled parts in the transconductance amplifier TA of FIG. 5.

FIG. 10 is a diagram showing the transistors M1 and M3 and their coupled parts in the transconductance amplifier TA of FIG. 5. A cascode-added source-grounded amplifier is configured with the transistors M1 and M3 in FIG. 10. The transistor M1 is a source-grounded transistor, and the transistor M3 is a cascode transistor. In the envelope tracking technique, as the amplitude of an input signal inputted to the gate of the transistor M1 increases, the drain voltage (drain-source voltage) of the source-grounded transistor M1 is increased, thereby improving the linearity of the input-output characteristic of the amplifier.

Figure 11A:
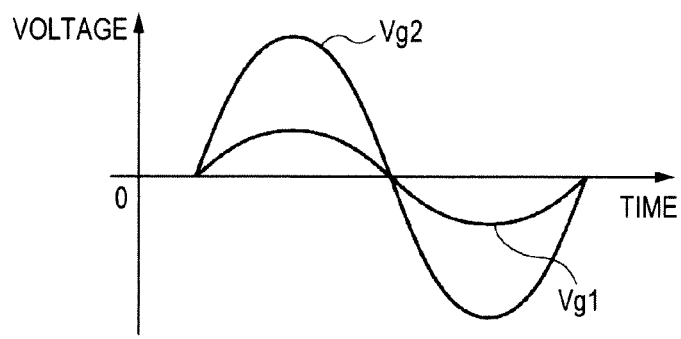
FIGS. 11A and 11B are diagrams showing voltage waveforms of various parts in FIG. 10.
Figure 11B:
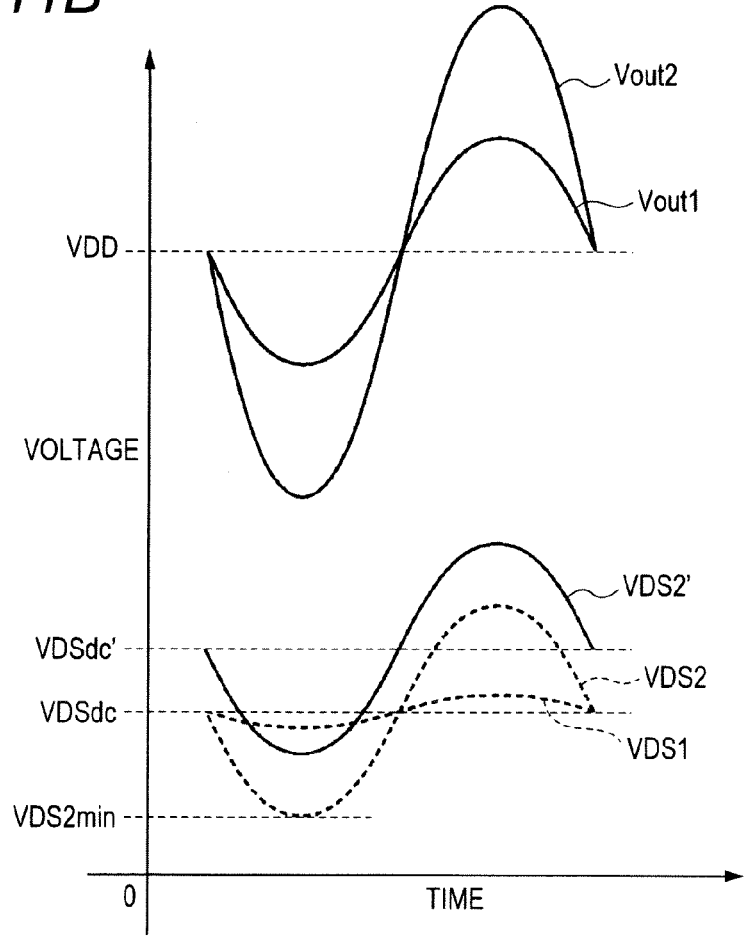

FIGS. 11A and 11B are diagrams showing voltage waveforms of various parts in FIG. 10. Referring to FIG. 10 and FIGS. 11A and 11B, FIG. 11A shows voltage waveforms of an input signal Vg inputted to the gate of the transistor M1 in FIG. 10. An input signal Vg1 is of relatively small voltage amplitude, and an input signal Vg2 is of relatively large voltage amplitude.

FIG. 11B shows waveforms of the drain voltage VDS of the transistor M1 in FIG. 10 and voltage waveforms of an output signal Vout outputted from the output terminal OUTn. A drain voltage VDS1 and an output signal Vout1 correspond to the input signal Vg1. A drain voltage VDS2 and an output signal Vout2 correspond to the input signal Vg2.

In the case of the input signal Vg1 of relatively small amplitude, the voltage amplitude of the output signal Vout1 is small. Therefore, the transistor M3 operates in a saturation region, and the voltage amplitude of the drain voltage VDS1 of the transistor M1 is also small.

In the case of the input signal Vg2 of relatively large amplitude, the voltage amplitude of the output signal Vout2 is large. Therefore, the transistor M3 operates in a linear region, and the voltage amplitude of the drain voltage VDS2 of the transistor M1 is also large. As a result, the transistor M1 also operates in a linear region, which decreases the transconductance Gm of the transistor M1 and degrades the linearity of the input-output characteristic of the amplifier. Particularly, the output signal Vout2 is largely distorted at the minimum value VDS2min of the drain voltage VDS2.

To deal with this, in the case of the input signal Vg2 of relatively large amplitude, the bias voltage Vdet applied to the gate of the transistor M3 is increased. Thereby, the DC component of the drain voltage is increased from VDSdc to VDSdc'; accordingly, the drain voltage of the transistor M1 is also increased from VDS2 to VDS2'. As a result, the transistor M1 operates in a saturation region, which increases the transconductance Gm of the transistor M1 and improves the linearity of the input-output characteristic of the amplifier.

Figure 12:
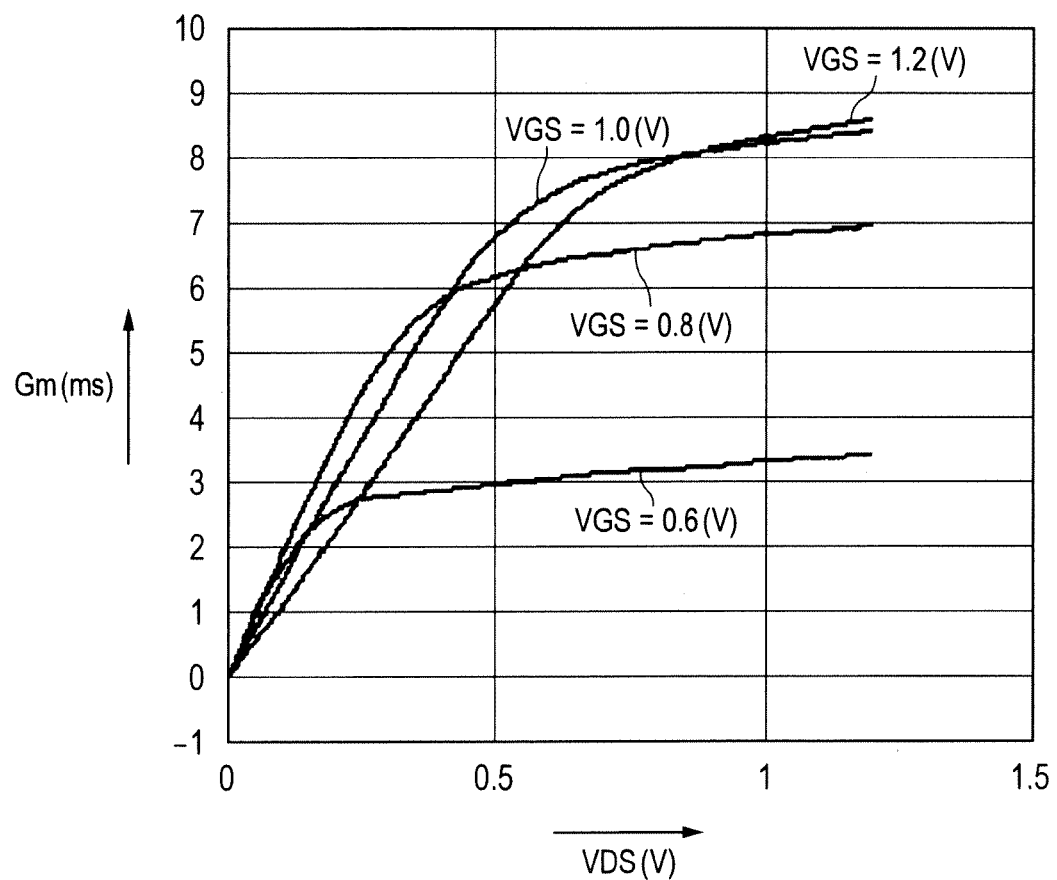
FIG. 12 is a diagram showing the relationship between the transconductance Gm of the transistor M1 and a drain voltage VDS.

FIG. 12 is a diagram showing the relationship between the transconductance Gm of the transistor M1 and the drain voltage VDS. FIG. 12 shows respective relationships in the case of gate voltages (gate-source voltages) VGS of 0.6, 0.8, 1.0, and 1.2 (V). As shown in FIG. 12, the transconductance Gm increases as the drain voltage VDS increases. This phenomenon becomes more pronounced with shorter channel length of the transistor.

Figure 13:
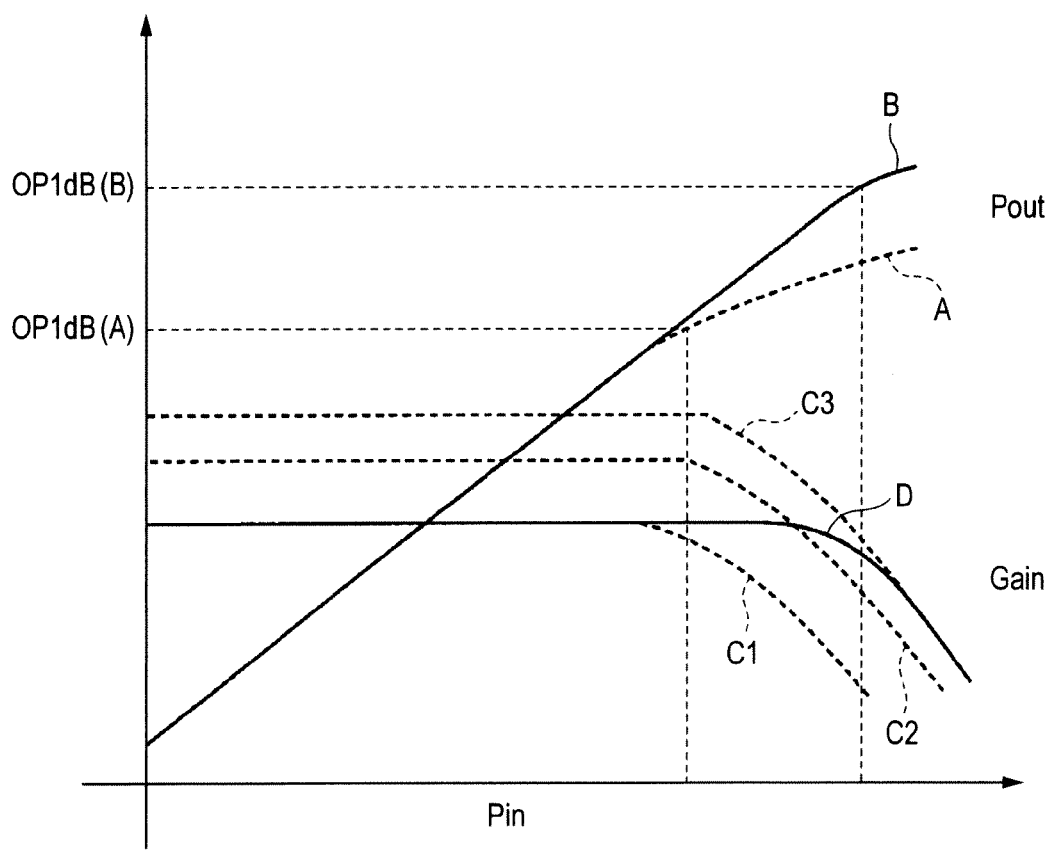
FIG. 13 is a diagram conceptually showing changes in characteristics of the amplifier caused by the presence or absence of envelope tracking.

FIG. 13 is a diagram conceptually showing changes in characteristics of the amplifier caused by the presence or absence of envelope tracking.

In FIG. 13, a dashed graph A represents the relationship between the input power Pin and the output power Pout in the absence of envelope tracking, and a solid graph B represents the relationship between the input power Pin and the output power Pout in the presence of envelope tracking. The use of envelope tracking improves a 1 dB output compression point (OP1 dB).

In FIG. 13, dashed graphs C1, C2, and C3 each represent the relationship between the input power Pin and the gain Gain in the absence of envelope tracking. The drain-source voltage increases in the order of C1, C2, and C3. A solid graph D represents the relationship between the input power Pin and the gain Gain in the presence of envelope tracking. In the envelope tracking, the drain-source voltage is increased as the amplitude of the input signal increases. This makes it possible to improve the linearity of the amplifier.

[Operation Principle of Detection Circuit]

Next, the operation principle of the detection circuit 40 of FIG. 6 will be described.

Figure 14:
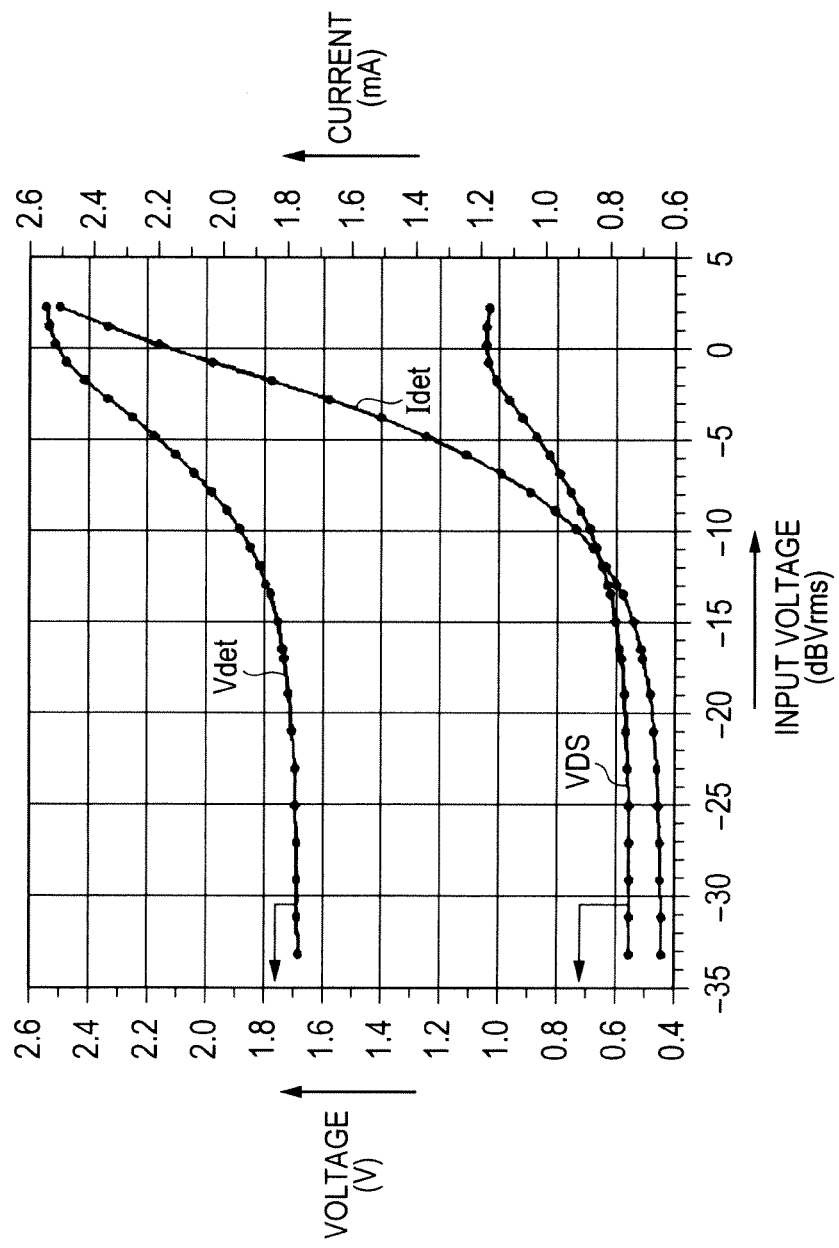
FIG. 14 is a diagram showing the relationship between the amplitude of an input voltage Vin and a detection current Idet in the detection circuit 40 of FIG. 6.

FIG. 14 is a diagram showing the relationship between the amplitude of the input voltage Vin and the detection current Idet in the detection circuit 40 of FIG. 6. FIG. 14 also shows the relationship between the bias voltage Vdet applied to the gates of the transistors M3 and M4 in FIG. 5 and the amplitude of the input voltage Vin and the relationship between the drain voltage VDS of the transistors M1 and M2 and the amplitude of the input voltage Vin.

The magnitude of a common mode current flowing through the source-grounded differential amplifier circuit depends on the amplitude of the input voltage Vin. In the detection circuit 40 of FIG. 6, the common mode current is observed as the detection current Idet flowing through the transistor MF31. As shown in FIG. 14, the detection current Idet increases as the amplitude of the input voltage Vin increases; therefore, it is possible to detect the input voltage Vin through the detection current Idet.

The bias voltage Vdet applied to the gates of the transistors M3 and M4 in FIG. 5 is generated using the detection current Idet. Therefore, the bias voltage Vdet also increases as the amplitude of the input voltage Vin increases. As the bias voltage Vdet increases, the drain voltages VDS of the transistors M1 and M2 in FIG. 5 also increase, which can prevent signals outputted from the output terminals OUTp and OUTn from being distorted.

[Simulation Result]

Hereinafter, the effect of the RFPGA (variable gain control circuit) 35 according to the first embodiment will be described based on simulation results.

Figure 15:
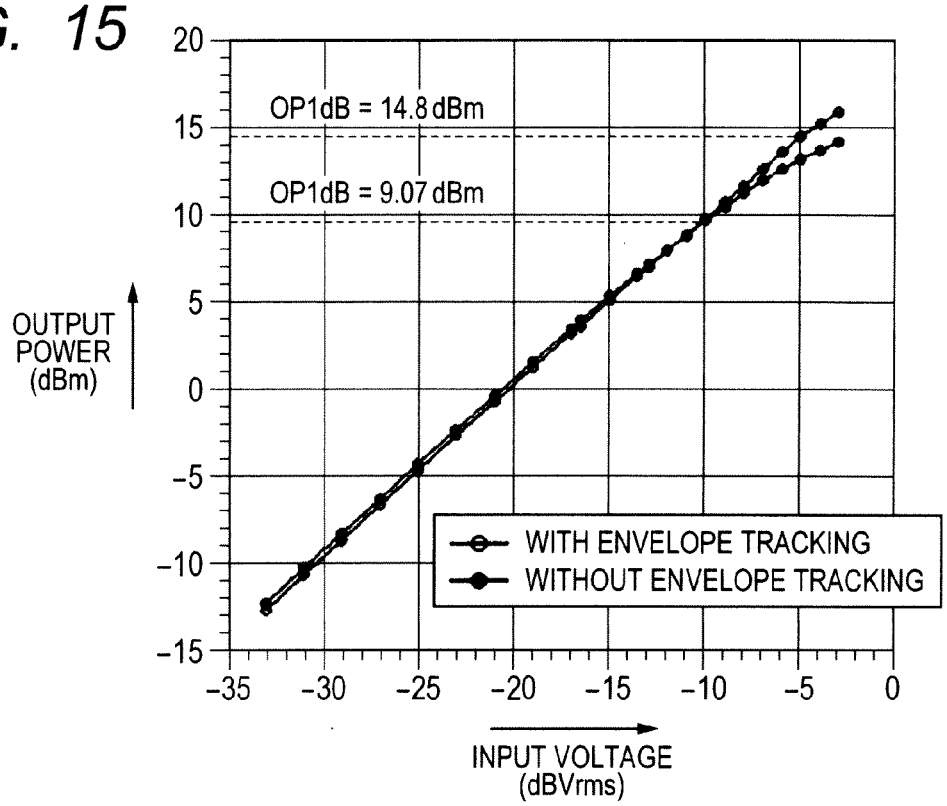
FIG. 15 is a diagram showing simulation results of the input-output characteristic of the RFPGA.

FIG. 15 is a diagram showing simulation results of the input-output characteristic of the RFPGA. Referring to FIG. 15, in the absence of envelope tracking indicated by black circles, OP1 dB is 9.07 dBm. In the presence of envelope tracking indicated by white circle, OP1 dB is 14.8 dBm. As seen from these simulation results, the application of the envelope tracking technique improves the linear characteristic by about 5 dB.

Figure 16:
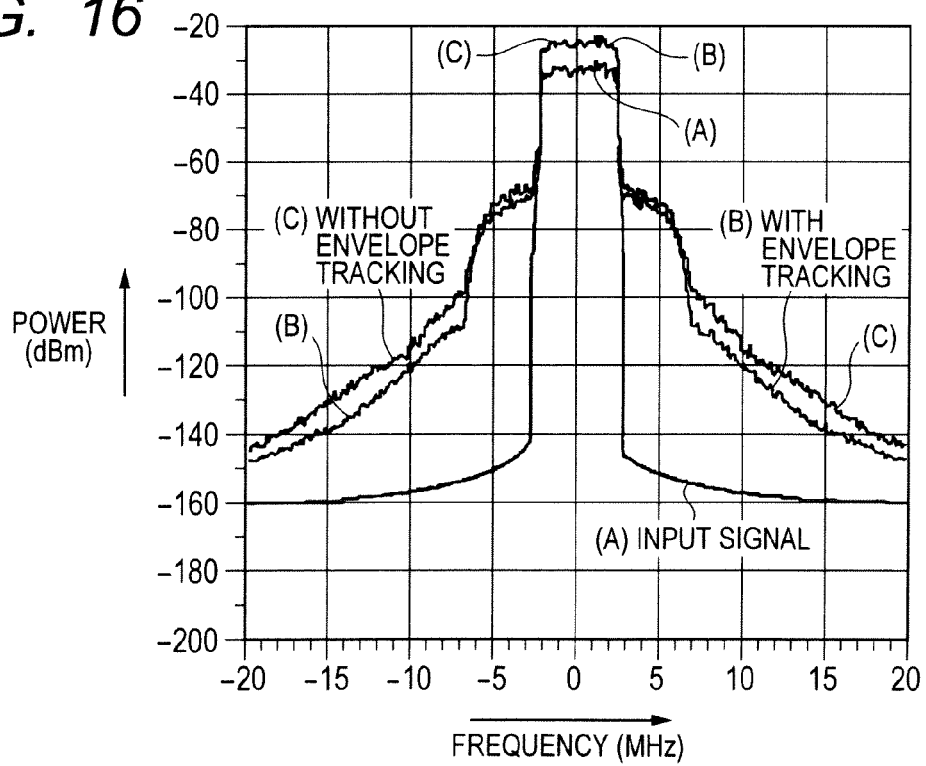
FIG. 16 is a diagram showing power spectra of an input signal and output signals in the case of inputting an LTE modulated signal having a bandwidth of 5 MHz to the RFPGA.

FIG. 16 is a diagram showing power spectra of an input signal and output signals in the case of inputting an LTE modulated signal having a bandwidth of 5 MHz to the RFPGA. In FIG. 16, the horizontal axis represents the frequency with the center of the band of the input signal as zero.

A curve (A) represents the power spectrum of the input signal. The LTE modulated signal having a frequency band of ±2.25 MHz with respect to the center frequency is inputted. A curve (B) represents the power spectrum of the output signal in the presence of envelope tracking, and a curve (C) represents the power spectrum of the output signal in the absence of envelope tracking.

Leakage power to adjacent channels (2.5 MHz to 7.5 MHz and -2.5 MHz to -7.5 MHz) is evaluated based on FIG. 16. The adjacent channel leakage ratio (ACLR) is -47 dBc/4.5 MHz in the absence of envelope tracking, and -49 dBc/4.5 MHz in the presence of envelope tracking. As seen from these results, ACLR is improved by 2 dB.

[Summary]

As described above, according to the first embodiment, it is possible to provide the RFPGA that can control the gain with a high dynamic range in accurate steps, reduce noise, and have high linearity by envelope tracking.

Second Embodiment

In the RFPGA according to the first embodiment, it is possible to improve the linearity of the input-output characteristic by adopting the envelope tracking technique. In the envelope tracking technique, the gate bias voltage of the cascode transistors M3 and M4 provided in the transconductance amplifier TA is adjusted based on the amplitude of the detected input signal, as illustrated in FIGS. 5 and 6. In the case of the amplifier units Amp15 to Amp18, the linearity of the input-output characteristic is improved by this method, whereas in the case of the amplifier units Amp1 to Amp14, there is a possibility that the linearity of the input-output characteristic is degraded. The reason is as follows.

The amplitudes of the input signals of the amplifier units Amp1 to Amp14 are obtained by attenuation through the resistor ladder 42 illustrated in FIG. 4, and are therefore smaller than the amplitude of the input signal detected by the detection circuit 40. Therefore, there is a possibility that the gate bias voltage of the cascode transistors M3 and M4 provided in the transconductance amplifiers TA of the amplifier units Amp1 to Amp14 becomes higher than necessary when the amplitude of the input signal increases. As a result, the transconductance Gm of the amplifier units Amp1 to Amp14 increases as the amplitude of the input signal increases. This degrades the linearity of the input-output characteristic.

In consideration of the above possibility, the switching between envelope tracking and no envelope tracking is performed in the RFPGA according to the second embodiment. When any of the amplifier units Amp15 to Amp18 assumes the operating state, that is, the gain of the RFPGA is relatively large, envelope tracking is performed. When any of only the amplifier units Amp1 to Amp14 assumes the operating state, envelope tracking is not performed. This can further improve the linearity of the input-output characteristic of the RFPGA.

Figure 17:
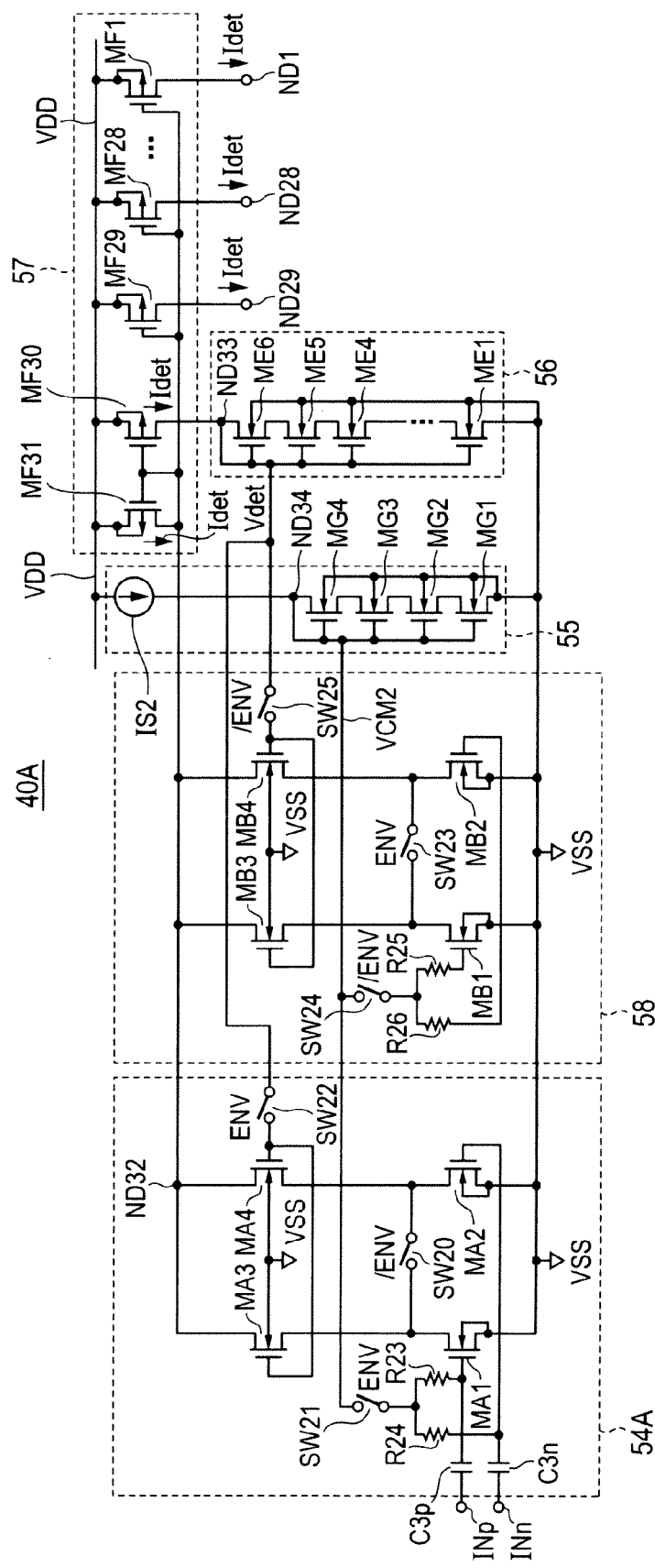
FIG. 17 is a circuit diagram showing the configuration of a detection circuit 40A used in the RFPGA according to a second embodiment of the invention.

FIG. 17 is a circuit diagram showing the configuration of a detection circuit 40A used in the RFPGA according to the second embodiment of the invention.

A first pseudo-differential amplifier 54A provided in the detection circuit 40A of FIG. 17 differs from the pseudo-differential amplifier 54 in FIG. 6 in that it further includes switch elements SW21 and SW22. The switch element SW21 is provided between the output node ND34 of the bias circuit 55 and the resistive elements R23 and R24. The switch element SW22 is provided between the output node ND33 of the bias circuit 56 and the gates of the transistors MA3 and MA4.

Further, the detection circuit 40A of FIG. 17 differs from the detection circuit 40 of FIG. 6 in that it includes a second pseudo-differential amplifier 58. The pseudo-differential amplifier 58 includes NMOS transistors MB1 to MB4, resistive elements R25 and R26, and switch elements SW23 to SW25. The pseudo-differential amplifier 58 is a replica of the pseudo-differential amplifier 51 provided in the transconductance amplifier TA of FIG. 5, and has almost the same configuration as the pseudo-differential amplifier 51. However, the input signal is not inputted to the gates of the transistors MB1 and MB2 through capacitors.

The relation of coupling of the elements included in the pseudo-differential amplifier 58 will be specifically described. The transistors MB1 and MB3 are coupled in series between the ground node VSS and the coupling node ND32 in this order. The transistors MB2 and MB4 are coupled in series between the ground node VSS and the coupling node ND32 in this order, and coupled in parallel with the series-coupled transistors MB1 and MB3. The bodies of the transistors MB1 to MB4 are coupled to the ground node VSS. The sizes of the transistors MB1 to MB4 are preferably equal to the sizes of the transistors M1 to M4 in FIG. 5, respectively. The gates of the transistors MB1 and MB2 are coupled to respective one ends of the resistive elements R25 and R26, and the respective other ends of the resistive elements R25 and R26 are coupled through the switch element SW24 to the output node ND34 of the bias circuit 55. The gates of the transistors MB3 and MB4 are coupled through the switch element SW25 to the output node ND33 of the bias circuit 56. The switch element SW23 is coupled between the drains of the transistors MB1 and MB2.

FIG. 17 further shows an example of the specific circuit configuration of the bias circuit 55. That is, the bias circuit 55 includes a constant current source IS2 provided between the power source line VDD and the output node ND34 and NMOS transistors MG1 to MG4 coupled in series between the output node ND34 and the ground node VSS. The gates of the transistors MG1 to MG4 are coupled to the output node ND34, and the bodies thereof are coupled to the ground node VSS. A current outputted from the constant current source IS2 flows through the series-coupled transistors MG1 to MG4 used as a load circuit, thereby generating the bias voltage VCM2 at the output node ND34.

In the detection circuit 40A having the above configuration, the switch elements SW20 to SW25 are turned on or off in accordance with a control signal ENV outputted from the APC 36 in FIG. 13. When the control signal ENV is asserted, i.e., when ENV="1" and/ENV="0", the switch elements SW21, SW22, and SW23 are turned on, and the switch elements SW20, SW24, and SW25 are turned off. As a result, the detection current Idet according to the amplitude of the differential input signal inputted between the input terminals INp and INn flows through the transistor MF31. The detection current Idet is copied by the current mirror circuit 57 to be outputted to the transconductance amplifiers TA configuring the amplifier units Amp1 to Amp18 in FIG. 4.

On the contrary, when the control signal ENV is deasserted, i.e., when ENV="0" and/ENV="1", the switch elements SW21, SW22, and SW23 are turned off, and the switch elements SW20, SW24, and SW25 are turned on. As a result, a current of a fixed magnitude, independent of the amplitude of the input signal, according to the bias voltage VCM2 outputted from the bias circuit 55 flows through the transistor MF31. The current of the fixed magnitude is copied by the current mirror circuit 57 to be outputted to the transconductance amplifiers TA configuring the amplifier units Amp1 to Amp18 in FIG. 4. Accordingly, a bias voltage of a fixed magnitude is applied to the gates of the cascode transistors M3 and M4 in each transconductance amplifier TA.

Since the others in FIG. 17 are the same as in the detection circuit 40 of FIG. 6, the same or corresponding parts are denoted by the same reference numerals, and their description will not be repeated. Further, since the entire RFPGA has the same configuration as the RFPGA 35 of FIG. 4 except that the detection circuit 40A of FIG. 17 is substituted for the detection circuit 40, its description will not be repeated.

Figure 18:
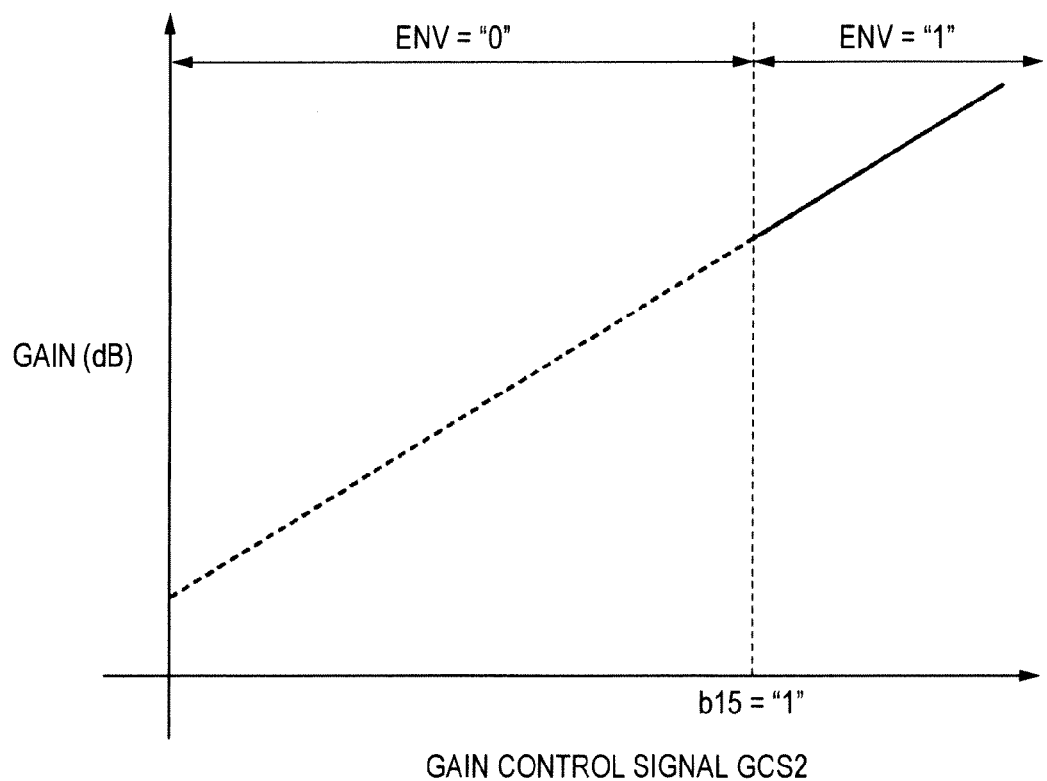
FIG. 18 is a diagram of assistance in explaining gain control in the RFPGA according to the second embodiment.

FIG. 18 is a diagram of assistance in explaining gain control in the RFPGA according to the second embodiment. Referring to FIG. 18, the gain of the RFPGA is determined by the gain control signal GCS2 which is a 29-bit digital code. Hereinafter, b29 represents the most significant bit of the gain control signal GCS2, b1 represents the least significant bit, and bi represents the ith significant bit. The least significant bit b1 to the 15th bit b15 correspond to the transconductance amplifiers TA of the amplifier units Amp1 to Amp15, respectively. The 16th and 17th bits b16 and b17 correspond to the amplifier unit Amp16, the 18th to 21st bits b18 to b21 correspond to the amplifier unit Amp17, and the 22nd bit b22 to the most significant bit b29 correspond to the amplifier unit Amp18. Until the 15th bit b15 corresponding to the amplifier unit Amp18 becomes "1", i.e., while the 15th and subsequent bits b15 to b29 are "0", the control signal ENV is deasserted (ENV="0"). When any of the 15th and subsequent bits b15 to b29 is "1", the control signal ENV is asserted (ENV="1").

FIG. 19 is a table listing the relationship between the control of the operating state of the amplifier units Amp1 to Amp18 and the gain of the RFPGA 35. In FIG. 19, a column showing the logic levels of the control signal ENV is added. The others in FIG. 19 are the same as in FIG. 7. As shown in FIG. 19, when the amplifier units Amp15 to Amp18 are in the non-operating state, the control signal ENV is deasserted (ENV="0"). When any of the amplifier units Amp15 to Amp18 assumes the operating state, the control signal ENV is asserted (ENV="1").

Figure 20:
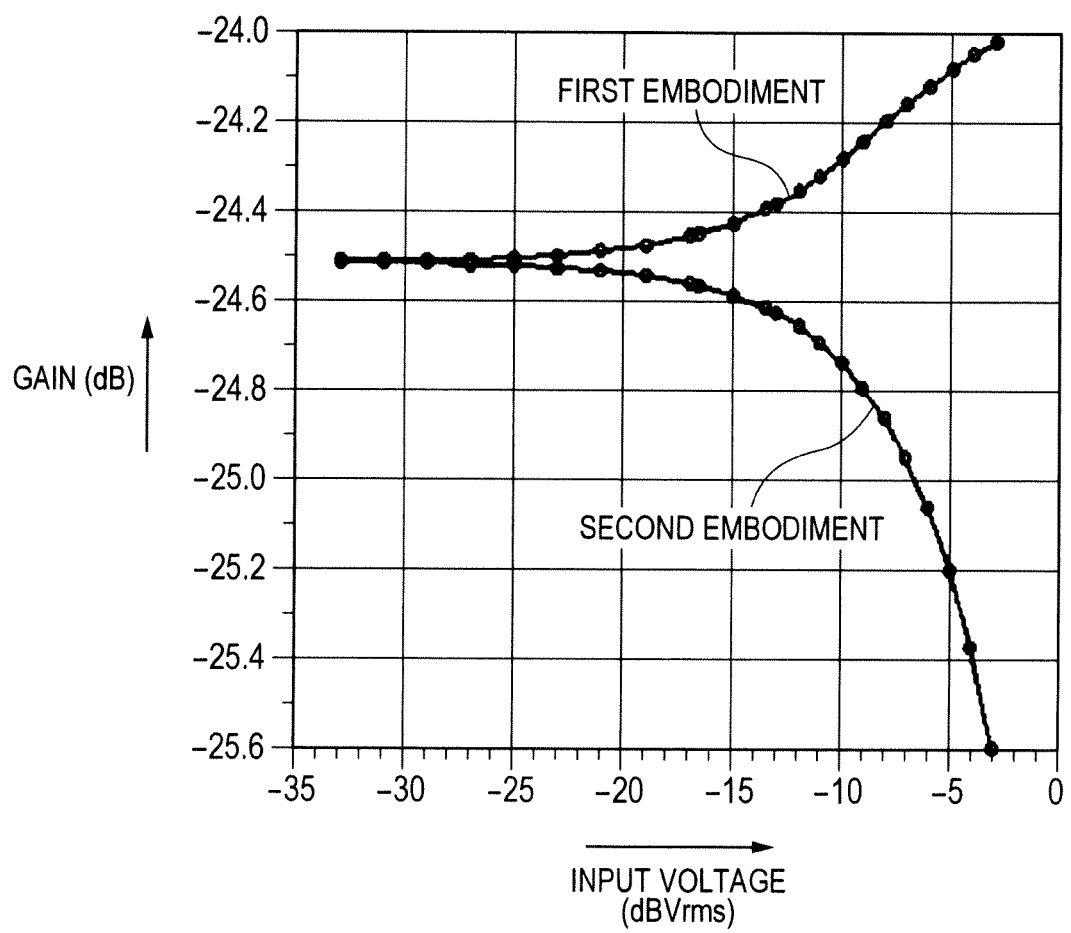
FIG. 20 is a diagram showing simulation results of the relationship between the amplitude of the input signal of the RFPGA and the gain.

FIG. 20 is a diagram showing simulation results of the relationship between the amplitude of the input signal of the RFPGA and the gain. In the simulations, only the amplifier unit Amp14 in FIG. 4 is put into the operating state, and the other amplifier units Amp are put into the non-operating state. In this case, envelope tracking is performed in the RFPGA according to the first embodiment, and envelope tracking is not performed in the RFPGA according to the second embodiment. In the first embodiment, the gain increases as the amplitude of the input signal increases. On the other hand, in the second embodiment, the gain does not increase as the amplitude of the input signal increases.

Figure 21A:
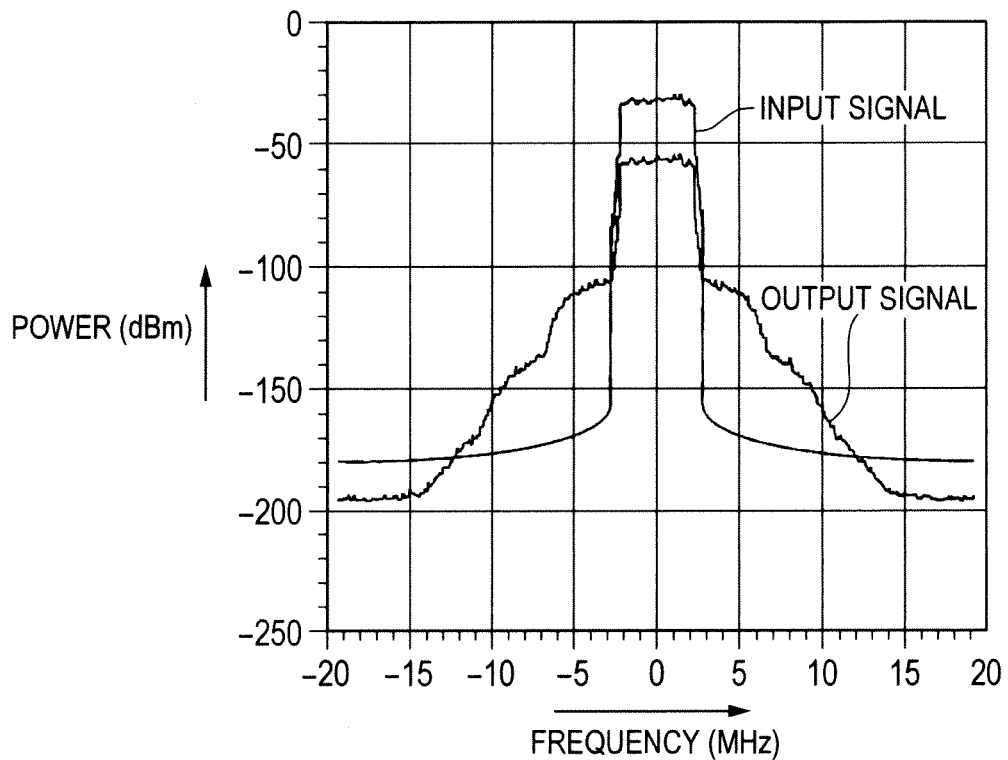
FIGS. 21A and 21B are diagrams showing power spectra of input signals and output signals in the case of inputting LTE modulated signals having a bandwidth of 5 MHz to the RFPGA.
Figure 21B:
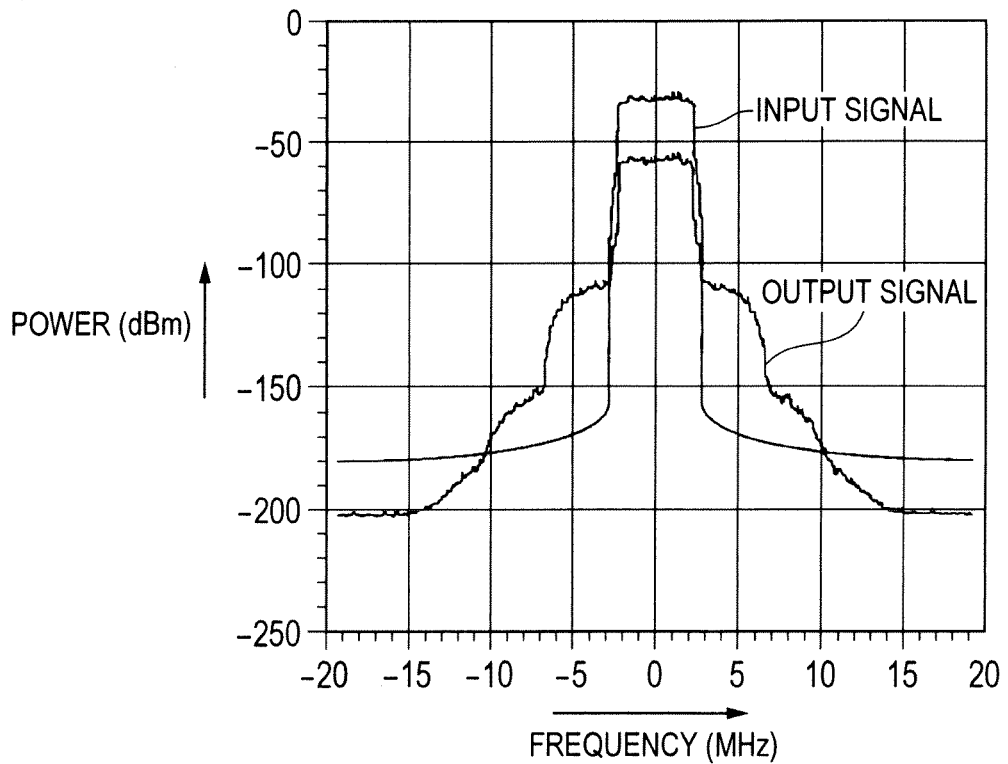

FIGS. 21A and 21B are diagrams showing power spectra of input signals and output signals in the case of inputting LTE modulated signals having a bandwidth of 5 MHz to the RFPGA. In FIGS. 21A and 21B, the horizontal axis represents the frequency with the center frequency of the input signal as zero. In the simulations, only the amplifier unit Amp14 in FIG. 4 is put into the operating state, and the other amplifier units Amp are put into the non-operating state. In this case, envelope tracking is performed in the RFPGA according to the first embodiment, and envelope tracking is not performed in the RFPGA according to the second embodiment.

FIG. 21A shows the power spectra of the input signal and the output signal in the RFPGA according to the first embodiment, and FIG. 21B shows the power spectra of the input signal and the output signal in the RFPGA according to the second embodiment. ACLR in the first embodiment shown in FIG. 21A is −53.6 dBc/4.5 MHz, and ACLR in the second embodiment shown in FIG. 21B is −55.0 dBc/4.5 MHz. As seen from these results, the distortion in the second embodiment is lower than that in the first embodiment.

The disclosed embodiments are to be considered in all respects as illustrative and not restrictive. The scope of the invention is indicated by the appended claims rather than by the foregoing description, and all changes that come within the meaning and range of equivalency of the claims are therefore intended to be embraced therein.

What is claimed is:

1. A semiconductor device comprising a variable gain amplifier circuit for amplifying an input signal by a gain according to a control signal,
the variable gain amplifier circuit including:
an output node for outputting an amplified input signal;
a plurality of amplifiers which are coupled in parallel with each other between the output node and a first reference node to which a first reference potential is provided and selectively assume an operating state in accordance with the control signal; and
a detection circuit which detects the input signal and outputs a detection signal according to a magnitude of the detected input signal to each of the amplifiers,
each of the amplifiers including:
a first transistor which receives, at its control electrode, the input signal or a signal proportional to the input signal;
a second transistor which is series-coupled to the first transistor between the first reference node and the output node; and
a first bias circuit which applies a DC voltage of a magnitude according to the detection signal to a control electrode of the second transistor.

2. The semiconductor device according to claim 1,
wherein the detection circuit includes:
a third transistor having a first main electrode coupled to a second reference node to which a second reference potential is provided;
a fourth transistor which receives, at its control electrode, the input signal;
a fifth transistor which is series-coupled to the fourth transistor between the first reference node and a second main electrode of the third transistor;
a plurality of sixth transistors which correspond to the amplifiers respectively and configure a current mirror circuit together with the third transistor;
a seventh transistor which configures a current mirror circuit together with the third transistor; and
a second bias circuit which applies a DC voltage of a magnitude according to a current flowing through the seventh transistor to a control electrode of the fifth transistor, and
wherein each of the amplifiers receives a current flowing through a corresponding sixth transistor as the detection signal.

3. The semiconductor device according to claim 2,
wherein respective first transistors included in the amplifiers are equal in size,
wherein respective second transistors included in the amplifiers are equal in size,
wherein the fourth transistor included in the detection circuit is equal in size to the first transistor included in each of the amplifiers, and
wherein the fifth transistor included in the detection circuit is equal in size to the second transistor included in each of the amplifiers.

4. The semiconductor device according to claim 2,
wherein in each of the amplifiers, the first bias circuit includes a first load circuit which is series-coupled to the corresponding sixth transistor between the first and second reference nodes,
wherein the DC voltage generated at the first load circuit by the current flowing through the corresponding sixth transistor is applied to the control electrode of the second transistor in each of the amplifiers,
wherein the second bias circuit includes a second load circuit which is series-coupled to the seventh transistor between the first and second reference nodes, and
wherein the DC voltage generated at the second load circuit by the current flowing through the seventh transistor is applied to the control electrode of the fifth transistor.

5. A semiconductor device comprising a variable gain amplifier circuit which receives first and second control signals and amplifies an input signal by a gain according to the first control signal,
the variable gain amplifier circuit including:
an output node for outputting an amplified input signal;
a plurality of amplifiers which are coupled in parallel with each other between the output node and a first reference node to which a first reference potential is provided and selectively assume an operating state in accordance with the first control signal; and a detection circuit which detects the input signal, outputs a detection signal according to a magnitude of the detected input signal to each of the amplifiers if the second control signal is asserted, and outputs a signal of a fixed magnitude to each of the amplifiers if the second control signal is deasserted, each of the amplifiers including:

a first transistor which receives, at its control electrode, the input signal or a signal proportional to the input signal;

a second transistor which is series-coupled to the first transistor between the first reference node and the output node; and a bias circuit which applies a DC voltage according to the detection signal or the signal of the fixed magnitude to a control electrode of the second transistor.

6. The semiconductor device according to claim 5, wherein the variable gain amplifier circuit is configured with a plurality of impedance elements, and further includes a ladder network which receives the input signal at one end, wherein each of some of the amplifiers is coupled to the ladder network, and receives, at the control electrode of the first transistor, a signal obtained by reducing the input signal by a magnification according to a position coupled to the ladder network, and each of amplifiers other than the some of the amplifiers receives, at the control electrode of the first transistor, the input signal, wherein the semiconductor device further comprises a control circuit for outputting the first and second control signals, wherein the control circuit deasserts the second control signal if only an amplifier that receives an input signal reduced equal to or less than a predetermined magnification selectively assumes the operating state in accordance with the first control signal, and wherein the control circuit asserts the second control signal if an amplifier that receives an input signal of a magnification more than the predetermined magnification is included among amplifiers that selectively assume the operating state in accordance with the first control signal.

* * * * *